(12) United States Patent
Otsuka et al.

(10) Patent No.: US 6,885,541 B2
(45) Date of Patent: Apr. 26, 2005

(54) CAPACITOR, AND CAPACITOR MANUFACTURING PROCESS

(75) Inventors: Jun Otsuka, Konan (JP); Manabu Sato, Nagoya (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 10/870,037

(22) Filed: Jun. 18, 2004

(65) Prior Publication Data

US 2004/0264103 A1 Dec. 30, 2004

(30) Foreign Application Priority Data

| Jun. 20, 2003 | (JP) | P. 2003-176894 |
| Jun. 20, 2003 | (JP) | P. 2003-176895 |
| Jun. 20, 2003 | (JP) | P. 2003-176897 |
| Apr. 27, 2004 | (JP) | P. 2004-130788 |

(51) Int. Cl.[7] ............................................. H01G 4/228
(52) U.S. Cl. ............................. 361/306.3; 361/306.1; 361/312; 361/313; 361/320; 361/321.1; 361/321.2
(58) Field of Search .......................... 361/306.2, 306.1, 361/306.3, 321.1, 321.5, 321.2, 311, 313, 301, 309, 308.1, 303, 312, 320

(56) References Cited

U.S. PATENT DOCUMENTS

| 6,023,407 A | 2/2000 | Farooq et al. |
| 6,034,864 A | 3/2000 | Naito et al. |
| 6,178,082 B1 | 1/2001 | Farooq et al. |
| 6,216,324 B1 | 4/2001 | Farooq et al. |
| 6,333,857 B1 * | 12/2001 | Kanbe et al. ............... 361/792 |
| 6,370,011 B1 | 4/2002 | Naito et al. |
| 6,462,932 B1 | 10/2002 | Naito et al. |
| 6,496,354 B2 | 12/2002 | Naito et al. |
| 6,549,395 B1 | 4/2003 | Naito et al. |
| 6,707,662 B2 * | 3/2004 | Waffenschmidt et al. ... 361/523 |
| 6,734,542 B2 * | 5/2004 | Nakatani et al. ............ 257/687 |
| 6,795,295 B2 * | 9/2004 | Murakami et al. ....... 361/306.3 |
| 2002/0109958 A1 | 8/2002 | Naito et al. |

FOREIGN PATENT DOCUMENTS

| JP | 11-204372 A | 7/1999 |
| JP | 3014383 B2 | 12/1999 |
| JP | 3098509 B2 | 8/2000 |

* cited by examiner

*Primary Examiner*—Anthony Dinkins
*Assistant Examiner*—Nguyen T. Ha
(74) *Attorney, Agent, or Firm*—Sughrue Mion, PLLC

(57) ABSTRACT

A capacitor comprising: a thin film laminate including a plurality of dielectric thin films and a plurality of electrode conductor thin films laminated alternately; and first kind terminals and second kind terminals formed over a first main surface of said thin film laminate and isolated from each other in a DC current, wherein a first kind electrode conductor thin films electrically connecting with said first kind terminals and a second kind electrode conductor thin films electrically connecting with said second kind terminals are so alternately laminated in a laminate direction as are separated by said dielectric thin films, and a first dielectric thin film, an other kind electrode conductor thin film and a second dielectric thin film are laminated in this order between one same kind electrode conductor thin film and other same kind electrode conductor thin film adjoining in said laminate direction, and first through holes, second through holes and the like are defined herein.

41 Claims, 22 Drawing Sheets

FIG.3
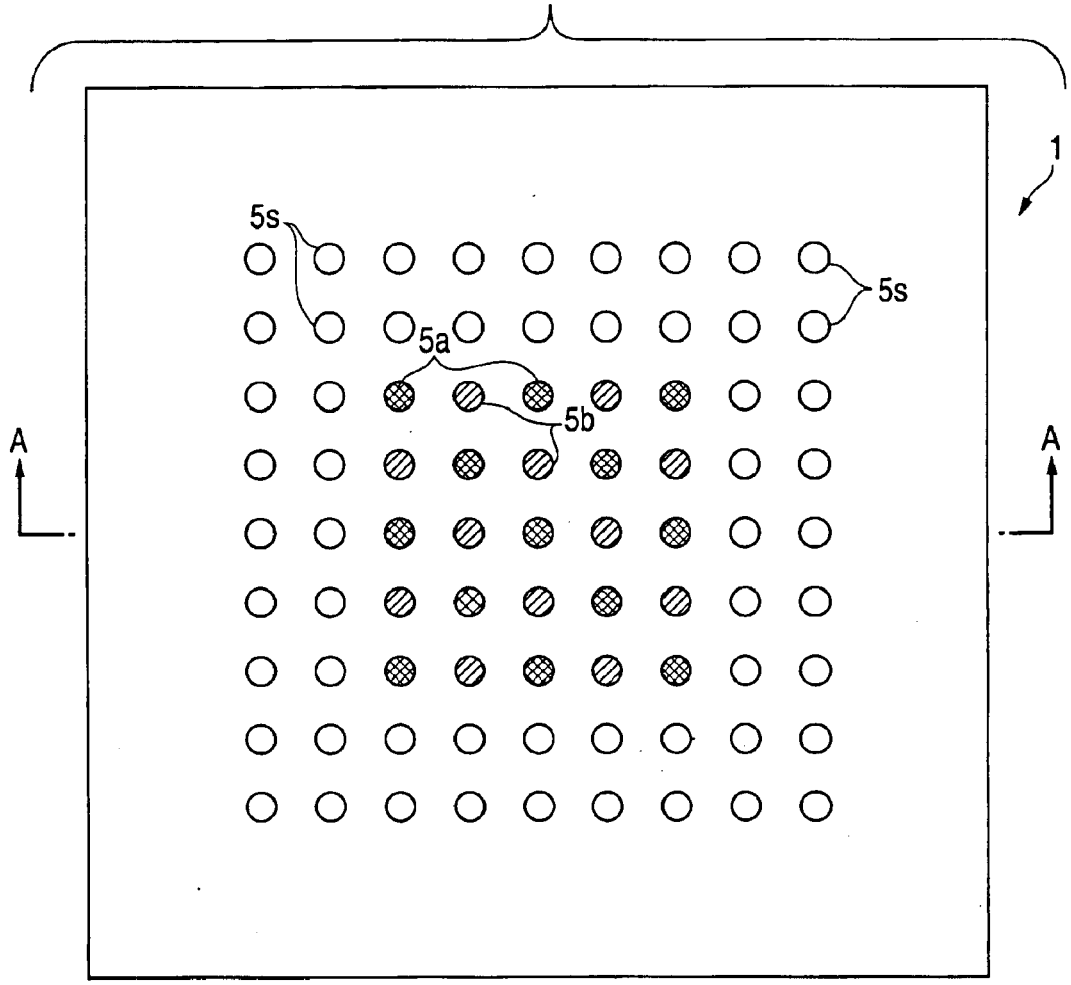
⊛ : POWER TERMINAL    ⊘ : GROUND TERMINAL
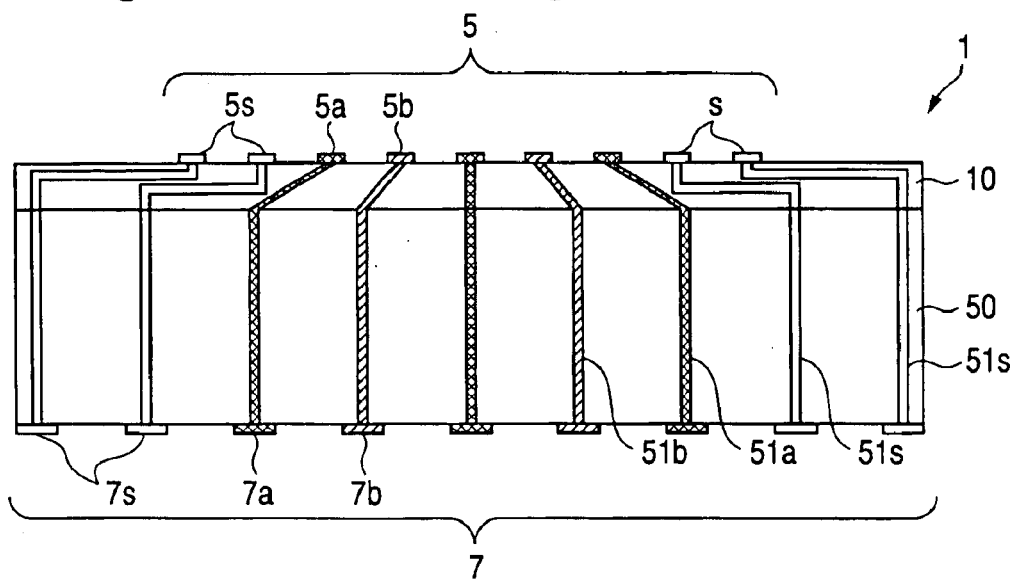

FIG.5
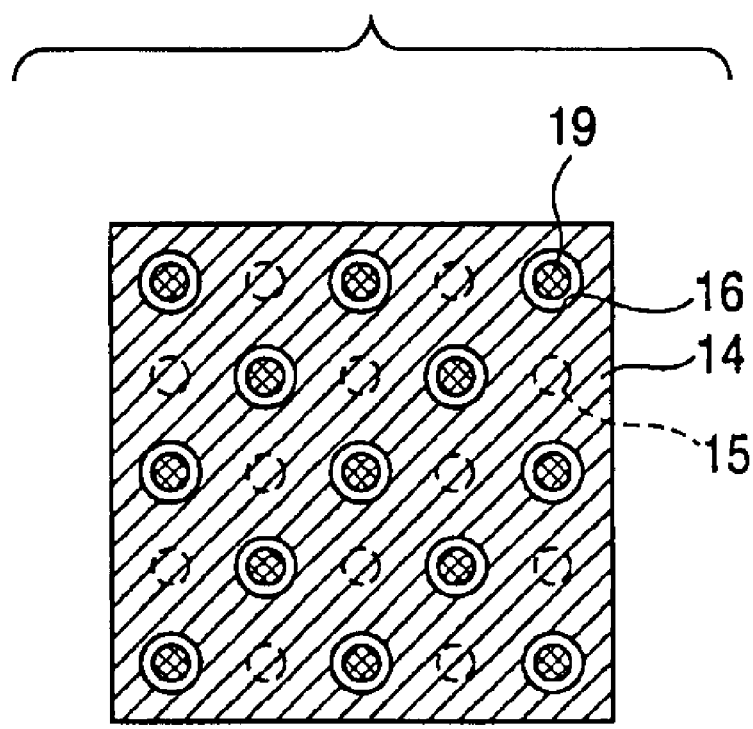
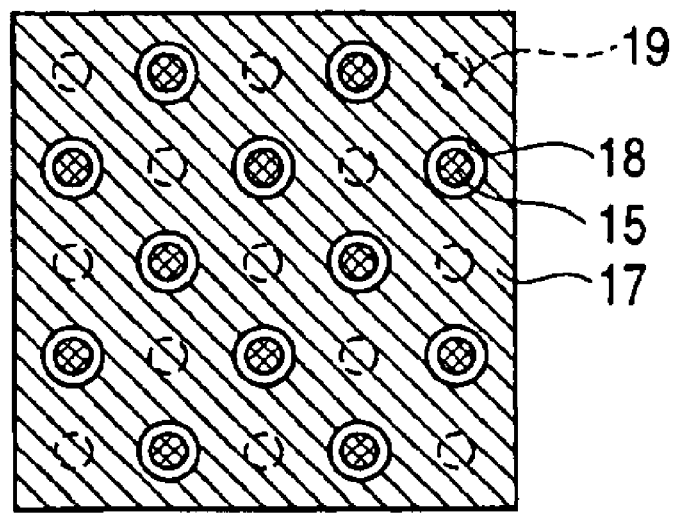

FIG.12
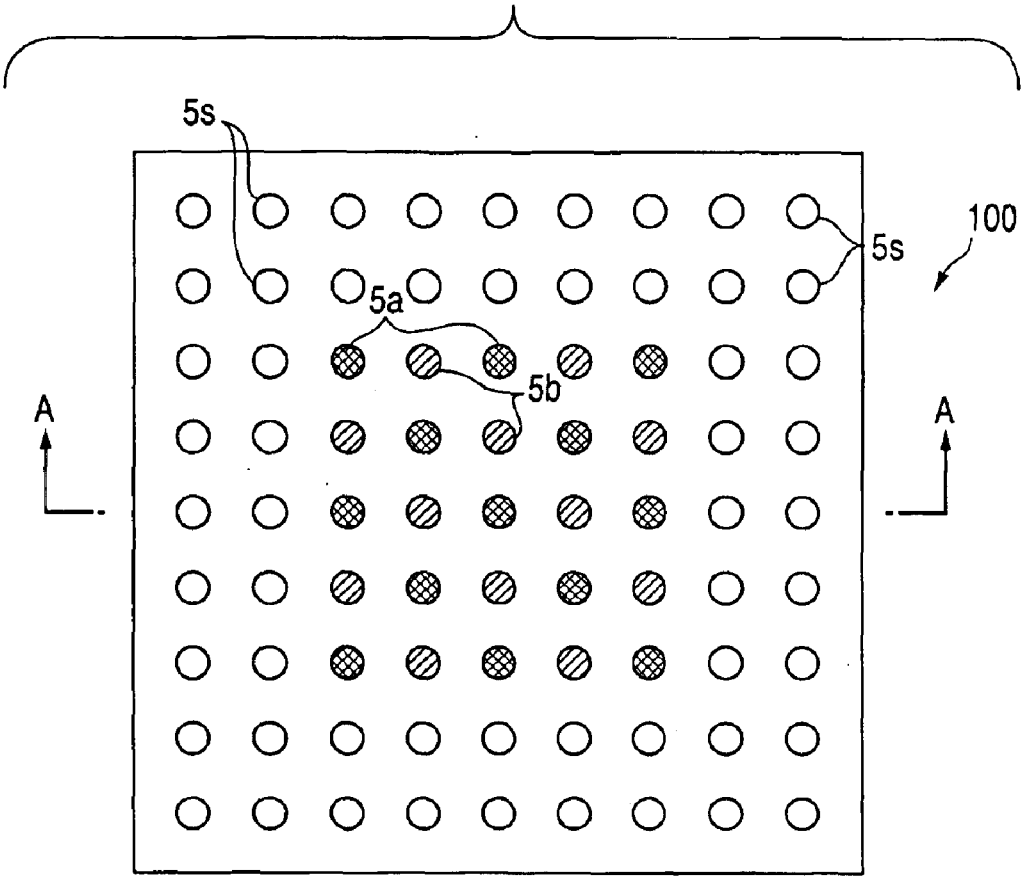
⊛ : POWER TERMINAL   ⊘ : GROUND TERMINAL
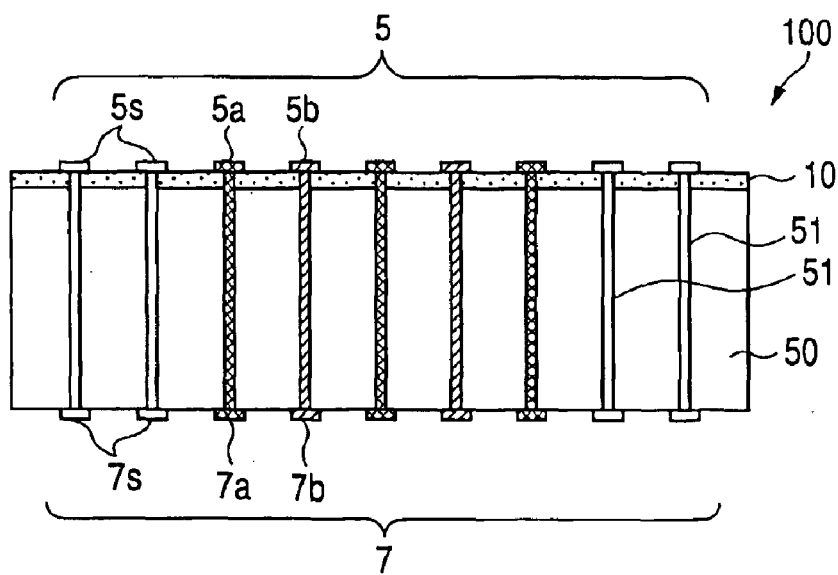

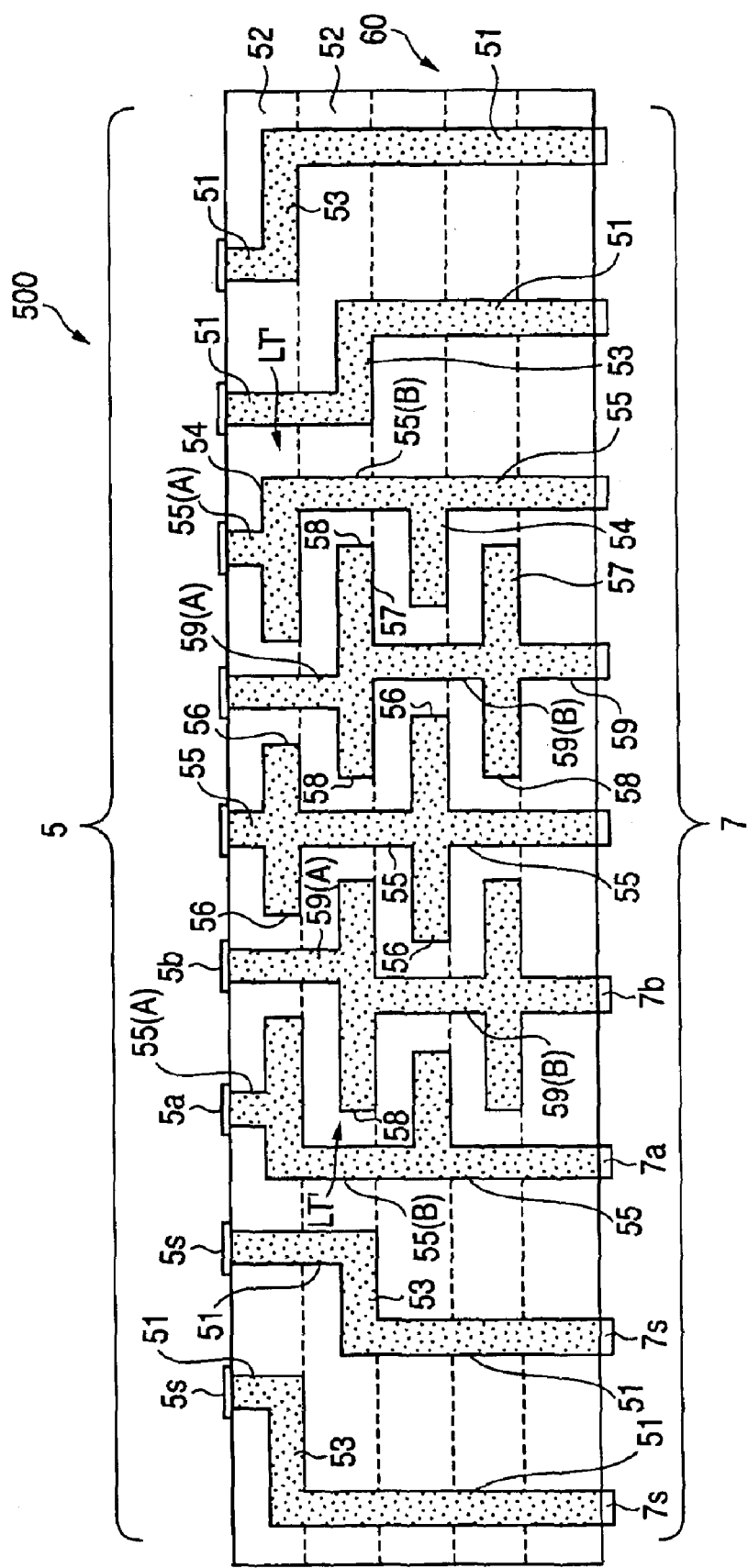
FIG.15-A

CAPACITOR, AND CAPACITOR MANUFACTURING PROCESS

FIELD OF THE INVENTION

This invention relates to a capacitor and a process for manufacturing the capacitor.

BACKGROUND OF THE INVENTION

In an integrated circuit device acting at a high speed such as the CPU or another LSI, power lines are shared in a form branched from a common power source among a plurality of circuit blocks in the integrated circuit. When a number of elements in the circuit blocks are simultaneously switched at a high speed, high currents are extracted all at once from the power source so that the fluctuations of the power voltage become a kind of noise. Thus, there arises a problem that the noise is propagated to the individual circuit blocks through the power lines. It is, therefore, effective for suppressing the noise propagation among the blocks due to the power voltage fluctuations that decoupling capacitors for lowering the power impedances are disposed in the individual circuit blocks. On the other hand, a bypass capacitor (as commonly called the "passcon") for eliminating the foreign noises such as the surge noises in an AC filtering manner may be provided in a similar connection mode.

In the case of the large-scale integrated circuit such as the CPU, the number of circuit blocks to be packaged and the number of power terminals or ground terminals are increasing so that the terminal distance becomes shorter and shorter. The decoupling capacitor has to be electrically connected with each power line to each circuit block. It is not only difficult for the mounting technique but also contrary to the tendency to a smaller size that the capacitors are individually electrically connected with the integrated circuit having the numerous terminals condensed.

In JP-A-2003-142624 and "Developments of Low Inductance Thin Film Decoupling Capacitor" by Kazuaki Kurihara, Electronics Mounting Technique, Vol. 19 (2003). No. 1, pp. 50, therefore, there is disclosed a thin film decoupling capacitor, in which ferroelectric thin films and metallic thin films are laminated and in which a number of capacitor terminals electrically connected individually with condensed integrated circuit side terminals are made by using the photolithography technique. In a high frequency region (especially at 100 MHz or higher) where the noise problem due to the power voltage fluctuations at a high-speed switching time comes out in the open, the weight of an inductive reactance term occupying the power impedance becomes serious. It is, therefore, effective for reducing the power impedance that the distance between the power terminals to electrically connect with the decoupling capacitors and the ground terminals is as short as possible. When the inductance at the terminals portions rises, it is coupled to the capacity component of the decoupling capacitors thereby to cause a resonance point. This causes a problem that the band width for a sufficient impedance reducing effect is narrowed. It is, therefore, advantageous for contributing to the intrinsic purpose such as the power impedance reduction and its widening that a thin film capacitor having a short terminal distance is manufactured by utilizing the photolithography technique, as described above.

SUMMARY OF THE INVENTION

In recent years, the device using the integrated circuit becomes remarkably smaller and smaller, and a small size is desired for the decoupling capacitor. In case of the small element size of the capacitor, however, it is difficult to realize a desired electrostatic capacity within a limited size. Especially in order to enhance the impedance reducing effect in a relatively low band, the decoupling capacitor is required to have a larger capacity. However, the thin film decoupling capacitor disclosed in JP-A-2003-142624 and "Developments of Low Inductance Thin Film Decoupling Capacitor" by Kazuaki Kurihara, Electronics Mounting Technique, Vol. 19 (2003), No. 1, pp. 50 just has two layers of capacitor electrodes, but no consideration is taken into the specific method for increasing the capacity or for compensating the reduction in the element size by the capacity.

An object of the invention is to provide a thin film capacitor having a larger electrostatic capacity even with a small size, and a process for manufacturing the capacitor.

In order to solve the problems thus far described, according to a first mode of the invention, there is provided a capacitor comprising: a thin film laminate including a plurality of dielectric thin films for forming the capacitor and a plurality of electrode conductor thin films laminated alternately; and first kind terminals and second kind terminals formed over the first main surface of the thin film laminate and isolated from each other in a DC current, wherein the first kind electrode conductor thin films electrically connecting with the first kind terminals and the second kind electrode conductor thin films electrically connecting with the second kind terminals are so alternately laminated in the laminate direction as are separated by the dielectric thin films, and wherein the first dielectric thin film, the other kind electrode conductor thin film and the second dielectric thin film are laminated in the recited order between one same kind electrode conductor thin film and other same kind electrode conductor thin film adjoining in the laminate direction, wherein first through holes formed in the first dielectric thin film and second through holes formed in the other kind electrode conductor thin film have an overlap in an in-plane projection, and wherein the second through holes and third through holes formed in the second dielectric thin film have an overlap in the in-plane projection, and wherein joint conductor portions for jointing the one same kind electrode conductor thin film and the other same kind electrode conductor thin film are so formed as a thin film portion integrated with at least either of the two same kind electrode conductor thin films as to fill the first through holes and the third through holes, so that the outer circumferences of the joint conductor portions and the inner circumferences of the second through holes are isolated in the DC current in the second through holes by dielectric hole filling portions integrated with the first dielectric thin film and the second dielectric thin film. Here in the invention, the "thin film" implies a film having a thickness of 1.5 μm or less.

According to this structure, the electrode conductor thin films of different polarities of the capacitor are composed of the first kind electrode conductor thin films and the second kind electrode conductor thin films. These first kind electrode conductor thin films and second kind electrode conductor thin films are alternately laminated through the plural dielectric thin films and are jointed by the joint conductor portions filling the (first and third) through holes formed in the dielectric thin films. The joint conductor portions are the thin film portions which are integrated with at least either of the two same kind electrode conductor thin films. At the joint conductor portions, moreover, the second through holes are formed at positions where the different kind electrode conductor thin films of different polarities intersect. The joint conductor thin film portions are arranged on the inner sides of the second through holes, and the outer circumferences of the joint conductor portions and the inner circumferences of the second through holes are isolated from each other in the DC current by the dielectric hole filling portions in the second through holes. Of the two kinds of electrode conductor thin films, therefore, the electrode conductor thin films of the same kind (i.e., of the same polarity at the time of using the capacitor) are connected in plurality in the DC current to each other by the joint conductor thin film portions. On the other hand, the plural layers of the different kinds (i.e., of the different polarities) are completely isolated in the DC current through the dielectric thin films and the dielectric hole filling portions. As a result, the electrode conductor thin films of each polarity are multi-layered and enlarged in their total area, and the realizable electrostatic capacity can be drastically increased even with the small element size by the thin film effect of the dielectric layers.

Moreover, the electrode conductor thin films and the (first to third) through holes to be formed in the dielectric thin films can be easily formed in the individual thin films by the photolithography technique. Moreover, the dielectric hole filling portions can be formed remarkably easily by depositing the material in the second through holes at the time of filming and depositing the dielectric thin films, and the joint conductor thin film portions can also be formed remarkably easily by depositing the material in the first to third through holes at the time of filming and depositing the electrode conductor thin films. In other words, the capacitor can be easily manufactured by simply repeating the patterning according to the photolithography technique and the general filming technique, even with the complicated joint structure, in which the electrode conductor thin films and the dielectric thin films are laminated in multiple layers in the laminate direction and in which the electrode conductor thin films of the different polarities are isolated from each other in the DC current.

It is desired that the dielectric thin films have a thickness of 10 nm or more and 1,000 nm or less. If the thickness of the dielectric thin films is less than 10 nm, the isolation between the electrode conductor thin films in the DC current by the dielectric thin films is deteriorated to cause the leakage current seriously. If the thickness of the dielectric thin films is more than 1,000 nm, the merits of the small size and the large capacity intrinsic to the thin film capacitor are not prominent. The thickness of the dielectric thin films is more desired to be 30 nm or more and 500 nm or less. In case the electrode conductor thin films are exemplified by metallic thin films, their thickness is desired to be 10 nm or more and 500 nm or less. If the thickness of the metallic thin films making the electrode conductor thin films is less than 10 nm, the sheet resistance of the thin films rises so that the DC resistance component to be added in series to the capacitor formed becomes higher from the viewpoint of the equivalent circuit. These thin films may deteriorate the impedance reducing effects or may narrow the band width due to the formation of the RC series resonance circuit, in case they are used in the decoupling capacitor or the "passcon". Moreover, it may become a cause for raising the cost to use the electrode conductor thin films having a thickness of 500 nm or more. The thickness of the electrode conductor thin films is more desired to be 50 nm or more and 300 nm or less.

In order to reduce the inductance and prevent the increase in the DC resistance, the electrode conductor thin films of the same kind jointed at the joint conductor portions are desirably provided with a plurality of joint conductor portions for electrically connecting with the electrode conductor thin films on the same main surface side. In this case, such ones of the joint conductor portions as are of different kinds and closest to each other are desired to have an edge distance of 20 $\mu$m or more and 300 $\mu$m or less. If the edge distance is less than 20 $\mu$m, a short circuit easily occurs between the joint conductor portions of the different kinds to be isolated in the DC current. Moreover, it is difficult to fill the dielectric layers between the joint conductor portions so that a defect such as a cavity may occur. If the edge distance is more 300 $\mu$m, moreover, the increase in the DC resistance of the capacitor is easily invited. If the joint conductor portions of the different kinds are brought closer to 300 $\mu$m or less, on the other hand, the apparent inductance of the joint conductor portions can be reduced by the mutually inductive canceling effect between the opposite phase AC waves to flow through the joint conductor portions of the different kinds, so that the impedance of the capacitor can be more lowered. Here, the adoption of the photolithography technique in the invention is advantageous in that the capacitor can be formed simply and highly precisely even in case it is used as the decoupling capacitor for an integrated circuit having a number of power terminals or ground terminals or in case the joint conductor portions are finely condensed to the aforementioned order of $\mu$m.

In this case, the first kind terminals and the second kind terminals can be arranged individually in plurality over the first main surface of the thin film laminate at a predetermined distance and can be jointed in the laminate direction either directly or through auxiliary joint conductor portions to the first kind electrode conductor thin film and the second kind electrode conductor thin film, respectively, which are closest to the first main surface. As a result, the distance from the electrode conductor thin films of the capacitor terminal portions can be drastically reduced to lower the inductance at the terminal portions thereby to lower the impedance. In case a terminal array, in which the plural first kind terminals and the plural second kind terminals are mixed, is formed on the first main surface of the thin film laminate, it is desired that the different kind terminals closest to each other in the terminal array have an edge distance of 20 $\mu$m or more and 300 $\mu$m or less. In case the capacitor is used as the decoupling capacitor, one of the different kind terminals functions as the power terminals whereas the other acts as the ground terminals. By setting those two closer at an edge distance of 300 $\mu$m or less, the apparent inductance of the terminal portions can be reduced to make the impedance of the capacitor lower, by the mutually inductive canceling effect of the AC waveforms of reverse phases to flow through the different kind terminals.

Next, a plurality of (as equal to the number of the first kind terminals or the second kind terminals electrically connecting with) joint conductor portions can be dispersed and formed for each electrode conductor thin film in the planes of the electrode conductor thin films. Thus, the DC resistance component and the parasitic inductance of the entire capacitor containing the joint conductor portions can be drastically reduced to provide a thin film capacitor of a lower impedance.

The electrode conductor thin films and the joint conductor portions can be made of a metal such as Cu, Ag, Au or Pt and are efficiently formed by the vapor deposition method such as the sputtering or vacuum deposition method. On the other hand, the dielectric thin films and the dielectric hole filling portions are efficiently formed by the vapor deposition method such as the high-frequency sputtering, reactive sputtering or chemical solution deposition (CVD) method, in the case of an inorganic dielectric material such as an oxide or nitride. On the other hand, dielectric thin films can be formed, if made of an oxide family, by the chemical solution deposition (CSD) method such as the so-called "sol-gel filming method". This chemical solution deposition method forms the dielectric thin films by drying or firing the layer, to which the solution of the compound material making the dielectric thin films is applied, and is advantageous in that it can form the dielectric thin films more conveniently than the vapor deposition method. According to the sol-gel method, for example, the dielectric thin films (e.g., oxide thin films) are obtained by applying and drying a sol composite of an organic metal solution to the plate-shaped base and then by firing the dried composite.

In case a capacitor of especially high electrostatic capacity is to be manufactured or in case the capacitor of that capacity is to be more small-sized, it is advantageous to use a dielectric material having a higher dielectric constant. For this purpose, it is desired that the dielectric thin films and the dielectric hole filling portions (are made of dielectric ceramics with high dielectric constant (as defined to have a specific dielectric constant of 50 or more: ferroelectric ceramics, for example). The dielectric ceramics with high dielectric constant is desirably made of a composite oxide having a perovskite type crystal structure, such as one kind or two kind or more of barium titanate, strontium titanate or lead titanate. This ceramics has an especially high dielectric constant and is prepared relatively easily so that it can be properly adopted in the invention. Here, the dielectric thin films made of the dielectric ceramics with high dielectric constant invite a serious reduction in the dielectric constant, if its crystallinity is deteriorated, so that it is desirably constructed as crystal thin films. In case the vapor deposition method such as the sputtering method is adopted, the crystallization can be promoted if the filling is made by heating the plate-shaped base. In case the chemical solution deposition method such as the sol-gel method is adopted, the crystallization of the films can be promoted by the firing treatment after the drying step.

According to a second mode of the invention, there can be provided a capacitor, in which the second main surface of the thin film laminate is jointed to the first main surface of a plate-shaped base, in which first kind base side terminals and second kind base side terminals isolated from each other in the DC current are formed on the second main surface of the plate-shaped base, and in which the first kind base side terminals and the second kind base side terminals are jointed to the first kind electrode conductor thin film and the second kind electrode conductor thin film, respectively, which are closest to the second main surface of the thin film laminate. With the first kind terminals and the second kind terminals formed on the first main surface of the thin film laminate, respectively, there can be solder-connected the power terminals and the ground terminals on the semiconductor element which is constructed of a silicon semiconductor chip or the like. With the first kind substrate side terminals and the second kind base side terminals on the side of the second main surface side of the plate-shaped base, respectively, there can be connected the power terminals and the ground terminals on the main substrate side, which are made mainly of a polymer material. Therefore, the capacitor having the structure thus made can function as the intermediate substrate which is positioned at an intermediate position between the semiconductor element and the main substrate thereby to intervene the connection in between.

Moreover, the decoupling capacitor can be brought closer to the semiconductor element by electrically connecting the capacitor functioning as the decoupling capacitor (or the "passcon") in the form of the intermediate substrate directly to the semiconductor element, thereby to shorten the wiring length between the power terminals and the decoupling capacitor. As a result, the inductance of the capacitor terminal portions can be lowered to contribute to the lower impedance of the decoupling capacitor. Moreover, the decoupling capacitor is assembled in the intermediate substrate so that it need not be arranged as another element on the back side of the main substrate. Thus, it is possible to reduce the number of parts or the size of the device.

In the construction of JP-A-2003-142624, the thin film capacitor is formed on the silicon substrate, and the semiconductor element is mounted on the thin film capacitor. After this, the silicon substrate is peeled off to form into the thin film capacitor solely into the intermediate substrate. This construction is defective in that an additional step is required for peeling the silicon substrate, and in that the thin film capacitor having the substrate peeled does not have a high rigidity. In case the main substrate or the connection target is made of mainly of a polymer material such as the mother board or the organic package substrate acting as a second-stage intermediate substrate, the difference in the linear expansion coefficient between the semiconductor element and the main substrate cannot be absorbed if a thermal history such as the solder reflow is added. This may lead to a drawback such as the solder peel or the damage of the thin film capacitor due to shortage of rigidity. When the base side terminals and the base side joint conductor portions are made in the plate-shaped base for the filming base of the thin film laminate or the thin film capacitor so that the plate-shaped base is incorporated as the component of the intermediate substrate, the base peeling step can be dispensed with, and the rigidity of the intermediate substrate can be drastically improved to prevent the aforementioned defects effectively.

From the viewpoint of the improvement in the rigidity, the plate-shaped base may be made thicker than the thin film laminate having a low rigidity. The material for the plate-shaped base may be a polymer. It is, however, more desirable for preventing the solder peel or the like at the terminals that the substrate material is selected to reduce the expansion coefficient differences between the semiconductor element (of silicon, for example) and the intermediate substrate and between the intermediate substrate and the main substrate made mainly of the polymer material, and further to lower the level of the thermal shearing stress to be applied to the individual terminals formed on the two faces of the intermediate substrate at the solder reflow time or the like. The silicon has a linear expansion coefficient as low as 2 to 3 ppm/° C. from the room temperature to about 300° C. for the solder reflow. On the contrary, the polymer material such as epoxy resin composing the main substrate (e.g., the mother board or the organic package substrate) has a high linear expansion coefficient of 17 to 20 ppm/° C. The dielectric ceramics with high dielectric constant of the dielectric layer composing the thin film laminate has a relatively high linear expansion coefficient of 12 to 13 ppm/° C. in the case of the aforementioned perovskite type oxide. It is, therefore, effective for reducing the aforementioned linear expansion coefficient difference and to lighten the shearing stress to act on the terminals that the plate-shaped base is made of a ceramic material having a lower linear expansion coefficient. This ceramic material can be exemplified by alumina (7 to 8 ppm/° C.) or glass ceramics prepared by adding 40 to 60 wt.

parts of inorganic ceramic filler such as alumina to borosilicate glass or borosilicate lead glass. Moreover, another ceramic material to be used is aluminum nitride, silicon nitride, mullite, silicon dioxide or magnesium oxide. From the viewpoint of similarity of the linear expansion coefficient to the semiconductor element, moreover, a material other than the ceramics can be silicon (although consideration has to be taken into the insulation from the capacitor assembled in the thin film laminate or a conductor portion electrically connecting with the capacitor).

Due to the aforementioned linear expansion coefficient difference, a relative displacement in an in-plane direction between the terminals may occur between the semiconductor element and the intermediate substrate and between the intermediate substrate and the main substrate. However, the relative displacement is constricted by the solder joint between the terminals so that the shearing stress is applied to the solder connection portion between the terminals. In this case, it is desired that the plate-shaped base making an essential portion of the intermediate substrate is made of a ceramic material having a higher Young's modulus than that of the dielectric ceramics with high dielectric constant making the dielectric thin films. As a result, the rigidity of the plate-shaped base is enhanced so that the elastic deformation on the side of the plate-shaped base can be little even with a more or less linear expansion coefficient difference. As a result, the shearing deformation displacement to act on the solder connection portion is reduced so that the drawback such as the peel or disconnection of the connection portion hardly occurs.

On the other hand, the plate-shaped base can also be constructed of the laminated ceramic capacitor base, in which the fired ceramic dielectric layers and the electrode conductor layers co-fired with the fired ceramic dielectric layers are alternately laminated. As a result, the electrostatic capacity of the entire capacitor can be more increased by both the thin film capacitor made into the thin film laminate and the fired type laminated ceramic capacitor made on the plate-shaped base side. Moreover, the parallel combination of the thin film capacitor having a relatively large capacity and a laminated ceramic capacitor having a smaller capacity can be realized with one element, and the impedance lowering effect can be retained over a wider frequency band. Here, the dielectric layer to be used in the laminated ceramic capacitor can also be constructed of normally dielectric ceramics. From the viewpoint of a higher capacity, however, the dielectric layer to be used in the laminated ceramic capacitor is desirably made of highly dielectric ceramic (e.g., the aforementioned perovskite type oxide layer).

The capacitor of the invention can be constructed such that a thin film laminate side terminal array, in which the plural first kind terminals and the plural second kind terminals are mixed, is formed on the first main surface of the thin film laminate, such that a base side terminal array, in which the plural first kind base side terminals and the plural second kind base side terminals are mixed, is formed on the second main surface of the plate-shaped base, and such that the base side terminal array has a terminal array pitch (distance) set larger than that of the thin film laminate side terminal array.

The terminal distance of the integrated circuit element to be electrically connected with the capacitor has a tendency to become shorter and shorter in recent years, as described hereinbefore. On the other hand, the terminal distance on the side of the main substrate may not be able to be drastically reduced from the viewpoint of manufacture cost. In this case, it may occur that the terminal distance of the integrated circuit element and the terminal distance on the side of the main substrate fail to be equal. If, however, the terminal array pitch of the base side terminal array formed on the second main surface of the plate-shaped base is set larger than that of the thin film laminate side terminal array to be formed on the first main surface of the thin film laminate in the capacitor making the intermediate substrate, as described above, the aforementioned terminal distances may be unequal on the surface and back of the capacitor acting the intermediate substrate. Even with this inequality, the two terminal array can be electrically connected without any problem.

In this case, in the thin film laminate side terminal array over the thin film laminate, the first kind terminals and the second kind terminals are jointed (or directly connected) in the laminate direction either directly or through auxiliary joint conductor portions to the first kind electrode conductor thin film closest to the first main surface. This joint is advantageous for reducing the inductance of the terminal portions of the thin film capacitor, as has already been described. On the first main surface of the plate-shaped base, on the other hand, the individual end portions of the first kind base side joint conductor portions electrically connecting with the first kind base side terminals and the second kind base side joint conductor portions electrically connecting with the second kind base side terminals are arrayed to have a larger distance than the end distance of the thin film laminate side terminal array, and can be individually jointed in the laminate direction either directly or through the auxiliary joint conductor portions to the first kind electrode conductor thin film and the second kind electrode conductor thin film, which are closest to the second main surface of the thin film laminate. In this case, the terminal distance has to be converted somewhere in the capacitor so that the narrow terminal distance on the side of the thin film laminate side terminal array may match the wide base side terminal array.

On the second main surface of the thin film laminate, for example, the first kind base side joint conductor portions and the second kind base side joint conductor portions can conduct with the first terminal joint conductor portions and the second terminal joint conductor portions, respectively, which are arrayed at a larger distance than in the thin film laminate side terminal array. In other words, this structure means that the conversion of the terminal distance was performed in the thin film laminate so that the terminal distance has already matched the base side joint conductor portions of the large distance on the first main surface of the plate-shaped base providing the interface with the thin film laminate. On the side of the plate-shaped base, therefore, the base side joint conductor portions need not be made fine so that they can be easily fired. On the thin film laminate side, on the other hand, it is relatively easy not only to make the fine arrangement of the thin film laminate side terminal array but also to prepare the converting portions of the terminal distance by applying the photolithography technique.

In this case, in the thin film laminate, at least one layer of the electrode conductor thin films is a distance converting thin film, in which the joint conductor portions (i.e., the joint conductor portions of the thin film laminate) are connected at a first array distance from the side of the thin film laminate side terminal array with the electrode conductor thin film and in which the joint conductor portions (i.e., either the joint conductor portions of the thin film laminate or the base side joint conductor portions) are connected at a second array distance larger than the first array distance from the side of the base side terminal array with the electrode conductor thin film. Herein, both the first array distance and the second array distance are defined to mean an average distance of the joint conductor portions. The terminal distance can be converted extremely simply by making different the positions of the corresponding joint conductor portions connected to the upper and lower sides of the distance converting thin film.

The invention can achieve the following advantages. In JP-A-2003-142624, a leading wiring portion (i.e., the third conductor layer, as designated by 32) for the terminal distance conversion is purposely disposed at the uppermost layer position in addition to the capacitor electrodes, as shown in FIG. 2. Not only the manufacture process is elongated by the increase in the layer number but also the long leading wiring portion is formed at the position connected directly to the terminal portions of the semiconductor element. Therefore, the inductance of the terminals portions highly increases to make the low impedance and the wide range difficult. If, however, the electrode conductor thin films forming the capacitor are utilized as the distance converting thin films, the aforementioned long leading wiring portion need not be formed or can be shortened to the minimum length so that the inductance of the terminal portions can be drastically lowered.

In this case, in the thin film laminate, at least one layer of the first kind electrode conductor thin films and at least one layer of the second kind electrode conductor thin films can be individually used as the distance converting thin films. As a result, the terminal distances can be easily converted in an independent manner while keeping the first kind terminals and the second kind terminals isolated in the DC current. In other words, the distances of the terminals of the individual kinds can be enlarged at different positions in the laminate direction by using the first kind electrode conductor thin films for enlarging the distance of the joint conductor portions to electrically connect with the first kind terminals and by using the second kind electrode conductor thin films for enlarging the distance of the joint conductor portions to electrically connect with the second kind terminals.

When the distances of the terminals of different kinds are to be made at the same positions in the laminate direction, through holes have to be formed in the electrode conductor thin films of the first polarity (i.e., one of the first kind and the second kind), and the conductor thin films of the second polarity (i.e., the other of the first kind and the second kind) have to be so arranged in the through holes with a relatively large area for increasing the terminal distance that they are spaced through dielectric members. These conductor thin films of the second polarity are in the same polarity as that of the conductor thin films adjoining through the dielectric thin films so that they hardly contribute to the electrostatic capacity formation. On the other hand, the electrode conductor thin films of the first polarity are in the polarity different from that of the conductor thin films adjoining through the dielectric thin films so that they play a main role for the electrostatic capacity formation. In order to arrange the conductor thin films of the second polarity, however, the through holes have to be made large so that the effective electrode area is reduced to lower the electrostatic capacity.

If, however, the distances of the terminals of the individual different kinds are enlarged at the positions different from each other in the laminate direction, the conductor thin films of the second polarity need not be mixed in the conductor thin films of the first polarity at the common positions in the laminate direction, so that the drop of the electrostatic capacity can be prevented. More specifically, when the first kind electrode conductor thin films and the second kind electrode conductor thin films are defined such that the same kind electrode conductor thin film closest on the side of the thin film laminate side terminal array with respect to the distance converting thin film is a before conversion thin film and such that the same kind electrode conductor thin film closest on the side of the base side terminal array is an after conversion thin film, the joint positions of the joint conductor portions are made identical to each other in the in-plane direction between the before conversion thin film and the distance converting thin film and between the distance converting thin film and the after conversion thin film, and wherein the second through holes for passing the joint conductor portions therethrough are formed in a mutually displaced positional relation in the two other kind electrode conductor thin films, which are individually positioned between the before conversion thin film and the distance converting thin film and between the distance converting thin film and the after conversion thin film. Although the terminal distance conversions are performed, therefore, the through holes formed in the first kind electrode conductor thin films and the second kind electrode conductor thin films can be sized to have the necessary minimum area for passing the joint conductor portions therethrough, so that the influences of the electrostatic capacity drop due to the formation of the through holes can be eliminated as much as possible.

In the case of the aforementioned expanding conversions of the terminal distances, some of the group of the first kind electrode conductor thin films and the second kind electrode conductor thin films to be laminated on the second main surface side of the thin film laminate can be given a larger area than the group of the first kind electrode conductor thin films and the second kind electrode conductor thin films to be laminated on the first main surface side by making use of the area difference between the thin film laminate side terminal array and the base side terminal array. As a result, the electrostatic capacity of the capacitor can be further enhanced.

Moreover, not only the first kind terminals and the second kind terminals but also the signal terminals can be formed on the first main surface of the thin film laminate. In this case, the signal terminals can be so electrically connected with the signal base side terminals formed on the second main surface of the plate-shaped base, through the signal joint conductor portions in the thin film laminate and the signal base side joint conductor portions in the plate-shaped base that they do not conduct with the electrode conductor thin films in the thin film laminate. As a result, the signal lines can also be simultaneously made in the thin film laminate and can be formed while avoiding the capacitor portion so that they exert little influence upon the signal quality. In this case, it is desired for preventing the capacitance coupling between the plural signal lines and for less mismatch of the impedance of the signal lines that the dielectric layer covering the signal joint conductor portions in the thin film laminate is made of a material having a lower dielectric constant than that of the dielectric layer covering the electrode conductor thin film.

Next, the capacitor of the invention can be constructed such that the second main surface of the thin film laminate is jointed to the first main surface of the plate-shaped base, such that the first kind base side terminals and the second kind base side terminals, which are isolated from each other in the DC current, are formed on the second main surface of the plate-shaped base, and such that the first kind base side terminals and the second kind base side terminals are electrically connected with the first kind electrode conductor thin film and the second kind electrode conductor thin film, respectively, which are closest to the second main surface of the thin film laminate. The power terminals and the ground terminals on the semiconductor element side, which are made of the silicon integrated circuit chip or the like, can be solder-electrically connected with the first kind terminals and the second kind terminals, respectively, which are formed on the first main surface of the thin film laminate. Moreover, the power terminals and the ground terminals on the main substrate side, which are made mainly of the polymer material, can be electrically connected with the first kind base side terminals and the second kind base side terminals on the second surface side of the plate-shaped base, respectively. Here, the plate-shaped base can be the wiring substrate (or the package substrate), and the main substrate can be the mother board.

Here, the wiring substrate is provided with the insulating layers and the conductor layers (or the wiring layer) and may especially be the multi-layered wiring substrate. For the inter-layer connections of those conductor layers, the joint conductor portions (i.e., the base side joint conductor portions) are formed in the substrate inside. The conductor layers may be formed either on the substrate surface or in the substrate. The conductor layers can function as the leading wiring lines to convert the terminal distance. For example, the upper base side joint conductor portions, which are jointed to the first kind electrode conductor thin film and the second kind electrode conductor thin film, respectively, closest to the second main surface of the thin film laminate, and the lower base side joint conductor portions, which are jointed to the first kind base side terminals and the second kind base side terminals, respectively, can be pitch-converted and jointed through the conductor layers (or the leading wiring layer portions) in the base. In this case, the array distance of the first terminal joint conductor portions and the second terminal joint conductor portions on the second main surface of the thin film laminate can be made smaller than that of the first kind base side joint conductor portions and the second kind base side joint conductor portions on the second main surface of the plate-shaped base (or the wiring substrate).

According to another aspect of the invention for solving the problems, there is provided a capacitor comprising: a thin film laminate including a plurality of dielectric thin films for forming the capacitor and a plurality of electrode conductor thin films laminated alternately; and first kind terminals and second kind terminals formed over the first main surface of the thin film laminate and isolated from each other in a DC current, wherein the first kind electrode conductor thin films electrically connecting with the first kind terminals and the second kind electrode conductor thin films electrically connecting with the second kind terminals are so alternately laminated in the laminate direction as are separated by the dielectric thin films, and wherein the first dielectric thin film, the other kind electrode conductor thin film and the second dielectric thin film are laminated in the recited order between one same kind electrode conductor thin film and other same kind electrode conductor thin film adjoining in the laminate direction, wherein, in the inner area which is defined by projecting the through holes formed in the other kind electrode conductor thin film in the laminate direction, there are positioned joint conductor portions, in which the one same kind electrode conductor thin films and the other same kind electrode conductor thin films are jointed to each other, wherein, between the joint conductor portions and the other kind electrode conductor thin films, there are interposed dielectric hole filling portions, in which the first dielectric thin films and the second dielectric thin films are integrated, and wherein the dielectric hole filling portions enclose the joint conductor portions in the inner area of the through holes so that the outer circumferences of the joint conductor portions and the inner circumferences of the through holes of the other kind electrode conductor thin films are isolated from each other in the DC current.

According to this structure, the electrode conductor thin films of the different polarities of the capacitor are composed of the first kind electrode conductor thin films and the second kind electrode conductor thin films, which are alternately laminated through the plural dielectric thin films and jointed through the joint conductor portions. At the positions where the electrode conductor thin films of the different kinds having the different polarities intersect, there are formed the through holes, in which the joint conductor thin film portions are positioned to isolate the outer circumferences of the joint conductor portions and the inner circumferences of the through holes in the DC current by the dielectric hole filling portions. Of the two kinds of electrode conductor thin films, therefore, the electrode conductor thin films of the same kind (i.e., of the same polarity at the time of using the capacitor) are connected in plurality in the DC current to each other by the joint conductor thin film portions. On the other hand, the plural layers of the different kinds (i.e., of the different polarities) are completely isolated in the DC current through the dielectric thin films and the dielectric hole filling portions. As a result, the electrode conductor thin films of each polarity are multi-layered and enlarged in their total area, and the realizable electrostatic capacity can be drastically increased even with the small element size by the thin film effect of the dielectric layers.

Moreover, the capacitor of the invention can be manufactured highly efficiently and precisely by adopting the process, as described in the following. According to the invention, there is provided a process for manufacturing a capacitor, comprising: a base preparing step of preparing a plate-shaped base, in which first kind base side joint conductor portions and second kind base side joint conductor portions isolated from each other in a DC current are exposed to a first main surface; and a thin film laminate forming step of a thin film laminate, in which a plurality of dielectric thin films for forming a capacitor and a plurality of electrode conductor thin films are alternately laminated, over the plate-shaped base, wherein the thin film laminate forming step includes:

a. the step of forming a first kind electrode conductor thin film electrically connecting with the first kind base side joint conductor portion but isolated from the second kind base side joint conductor portion, over the first main surface of the plate-shaped base;

b. the step of forming a first dielectric thin film for covering the first kind electrode conductor thin film;

c. the step of forming dielectric holes in said first dielectric thin film, forming a second kind electrode conductor thin film to connect with said second kind base side joint conductor portions inside said dielectric holes and to be isolated from said first kind base side joint conductor portions in a DC current, and forming communication portions for exposing said first dielectric thin film, in said second kind electrode conductor thin film;

d. the step of forming a second dielectric thin film, which is integrated with the first dielectric thin film in an inner area defined by projecting the communication portions formed in the second kind electrode conductor thin film in a laminate direction and which covers the second kind electrode conductor thin film and the communication portions formed in the second kind electrode conductor thin film; and e. the step of forming dielectric holes in the second dielectric thin film and optionally in the first dielectric thin film and forming an electrode conductor thin film to be electrically connected with the first kind electrode conductor thin film through the dielectric holes and to be isolated from the second kind electrode conductor thin film in the DC current.

Here, the phrase "forming communication portions for exposing the first dielectric thin film, in the second kind electrode conductor thin film" is construed to include the two embodiments: (1) forming through holes in the second electrode conductor film; and (2) forming the second electrode conductor thin film in advance in such a form as is separated by through grooves. Here, the mode of forming the through grooves in place of the through holes can also be applied to another case for exposing the adjoining underneath layer.

The process of the invention described above prepares the electrode conductor thin films and the dielectric thin films of the capacitor alternately one layer by one layer by using the photolithography technique or the like. At the time of manufacturing the multi-layered thin film capacitor, one key is the technique of electrically connecting the electrode conductor thin films of the same polarities such as the power terminals or the ground terminals, or the dielectric thin films with each other highly efficiently and precisely in the laminate direction. In the aforementioned process of the invention, as described at step d, the second dielectric thin films for covering the inner circumferences of the through holes of the second electrode conductor thin films are formed by integrating them with the second dielectric thin films in the inner areas of the through holes formed in the second kind electrode conductor thin films. As described at step e, moreover, the dielectric holes are formed in the openings of the dielectric thin film to connect the upper and lower same kind electrode conductor thin films (i.e., the first kind electrode conductor thin films and the third electrode conductor thin films). According to this procedure, the process for isolating the electrode conductor thin films of the different kinds from each other in the DC current and the process for electrically connecting the upper and lower adjoining dielectric thin films with each other are simultaneously proceeded, as shown in the lowermost diagram of FIG. 18 and in the upper two diagrams of FIG. 19. As a result, the capacitor can be manufactured highly efficiently and precisely at one unit. Therefore, the multi-layered thin film capacitor can be manufactured highly efficiently by repeating the steps thus far described.

Specifically, the aforementioned step a includes the step of forming the first kind electrode conductor thin film having first through holes for exposing the second kind base side joint conductor portions. Moreover, the step b includes the step of forming the first dielectric thin film to cover the surface of the first kind electrode conductor thin film and the inner circumferences of the first through holes formed in the first kind electrode conductor thin film.

Moreover, the step d can include: the step of forming the second dielectric thin film for covering the surface of the second kind electrode conductor thin film and the inner circumferences of the through holes formed in the second kind electrode conductor thin film; and the step of etching off a portion of the dielectric hole filling portions, which are formed of the first dielectric thin film and the second dielectric thin film integrated by the inner area of the through holes formed in the second kind electrode conductor thin films, while keeping the inner circumferences of the through holes of the second kind electrode conductor thin film being covered with the dielectric hole filling portions, thereby to form dielectric thin film side through holes leading to the first kind electrode conductor thin film. In this case, the step e includes the step of forming the electrode conductor thin film isolated from the second kind electrode conductor thin film in the DC current so that the electrode conductor thin film may take direct contact with the first kind electrode conductor thin film exposed to the insides of the dielectric thin film side through holes. According to this process, the first kind electrode conductor thin film and the second kind electrode conductor thin film can be reliably isolated in the DC current, and the electrode conductor thin films of the same polarity can be connected extremely simply with each other.

Moreover, the process can also be modified in the following manner.

The aforementioned step a includes the step of forming the first kind electrode conductor thin film having first through holes, which are etched in the donut shape while leaving the second kind joint conductor portions electrically connecting with the second kind base side joint conductor portions but insulated from the first kind electrode conductor thin film. Moreover, the step b includes the step of forming the first dielectric thin film to cover the surface of the first kind electrode conductor thin film and the inner circumferences of the first through holes formed in the first kind electrode conductor thin film.

Moreover, the through holes at the aforementioned step c are etched in the donut shape while leaving the first kind joint conductor portions electrically connecting with the first kind base side joint conductor portions but insulated from the second kind electrode conductor thin film. Moreover, the step d can include: the step of forming the second dielectric thin film for covering the surface of the second kind electrode conductor thin film and the inner circumferences of the through holes formed in the second kind electrode conductor thin film; and the step of etching off a portion of the dielectric hole filling portions, which are formed of the first dielectric thin film and the second dielectric thin film integrated by the inner area of the through holes formed in the second kind electrode conductor thin films, while keeping the inner circumferences of the through holes of the second kind electrode conductor thin film being covered with the dielectric hole filling portions, thereby to form dielectric thin film side through holes leading to the first kind electrode conductor thin film. In this case, the step e includes the step of forming the electrode conductor thin film isolated from the second kind electrode conductor thin film in the DC current so that the electrode conductor thin film may take direct contact with the first kind electrode conductor thin film exposed to the insides of the dielectric thin film side through holes. According to this process, too, the first kind electrode conductor thin film and the second kind electrode conductor thin film can be reliably isolated in the DC current, and the electrode conductor thin films of the same polarity can be connected extremely simply with each other.

In order to solve the aforementioned problems, according to a third mode of the invention, there is provided a capacitor comprising a laminate including a capacitor structure portion having dielectric layers and electrode conductor layers laminated alternately, wherein a plurality of first side first kind terminals and a plurality of first side second kind terminals, which are isolated from each other in a DC current, form a first terminal array on the first main surface of the laminate, and wherein a plurality of second side first kind terminals and a plurality of second side second kind terminals, which are isolated from each other in a DC current, form a second terminal array on the second main surface side, wherein the electrode conductor layers are formed such that first kind electrode conductor layers electrically connecting with the first kind terminals and second kind electrode conductor layers electrically connecting with the second kind terminals are so alternately laminated in a laminate direction as are spaced through the dielectric layers, and have joint conductor portions for jointing the first kind electrode conductor layers and the second kind electrode conductor layers individually to each other in a laminate direction, wherein, on the first main surface of the laminate, the first side first kind terminals and the first side second kind terminals of the first terminal array are jointed to the first kind electrode conductor layers and the second kind electrode conductor layers closest to the first main surface, respectively, either directly or through auxiliary joint conductor portions in the laminate direction, and wherein, on the second main surface of the laminate, the second side first kind terminals and the second side second kind terminals of the second terminal array are jointed to the first kind electrode conductor layers and the second kind electrode conductor layers closest to the second main surface, respectively, at a larger distance than that of said first terminal array either directly or through auxiliary joint conductor portions in the laminate direction.

With the first side first kind terminals and the first side second kind terminals formed on the first main surface of the thin film laminate, respectively, there can be solder-connected the power terminals and the ground terminals on the semiconductor element which is constructed of a silicon semiconductor chip or the like. With the second side first kind terminals and the second second kind terminals on the side of the second main surface side of the laminate, respectively, there can be connected the power terminals and the ground terminals on the main substrate side, which are made mainly of a polymer material. Therefore, the capacitor having the structure thus made can function as the intermediate substrate which is positioned at an intermediate position between the semiconductor element and the main substrate thereby to intervene the connection in between. Moreover, the decoupling capacitor can be brought closer to the semiconductor element by electrically connecting the capacitor functioning as the decoupling capacitor (or the "passcon") in the form of the intermediate substrate directly to the semiconductor element, thereby to shorten the wiring length between the power terminals and the decoupling capacitor. As a result, the inductance of the capacitor terminal portions can be lowered to contribute to the lower impedance of the decoupling capacitor. Moreover, the decoupling capacitor is assembled in the intermediate substrate so that it need not be arranged as another element on the back side of the main substrate. Thus, it is possible to reduce the number of parts or the size of the device.

Moreover, the terminal distance of the integrated circuit element to be electrically connected with the capacitor has a tendency to become shorter and shorter in recent years, as described hereinbefore. On the other hand, the terminal distance on the side of the main substrate may not be able to be drastically reduced from the viewpoint of manufacture cost. In this case, it may occur that the terminal distance of the integrated circuit element and the terminal distance on the side of the main substrate fail to be equal. If, however, the terminal array pitch of the first terminal array formed on the second main surface of the laminate is set larger than that of the second terminal array to be formed on the first main surface of the thin film laminate in the capacitor making the intermediate substrate, as described above, the aforementioned terminal distances may be unequal on the surface and back of the capacitor acting the intermediate substrate. Even with this inequality, the two terminal array can be electrically connected without any problem.

Moreover, the first side first kind terminals and the first side second kind terminals of the first terminal array are jointed in the laminate direction either directly or through auxiliary joint conductor portions to the first kind electrode conductor layer and the second kind electrode conductor layer, respectively, which are closest to the first main surface. On the second main surface of the laminate, the second side first kind terminals and the second side second kind terminals of the second terminal array are jointed at a wider distance than the first terminal array in the laminate direction to the first kind electrode conductor layer and the second kind electrode conductor layer, respectively, which are closest to the second main surface, either directly or through auxiliary joint conductor portions. In any of the first terminal array or the second terminal array, the conductor portions to electrically connect directly with the terminals are either the electrode conductor layers making the capacitor or the auxiliary joint conductor portions electrically connecting with the electrode conductor layers in the laminate direction. As a result, it is possible to exclude such a leading wiring portion effectively as causes the increase in the inductance, as disclosed in JP-A-2003-142624, and to lower the impedance and widen the band of the capacitor. Moreover, the leading wiring portion need not be provided separately of the electrode conductor layer so that the structure can be simplified to simplify the manufacture process.

The capacitor of the third mode of the invention can be modified such that the plural dielectric layers and the plural electrode conductor layers are alternately laminated in the laminate, and such that at least one layer of the electrode conductor layers is a distance converting layer, to which the joint conductor portions are electrically connected at a first array distance from the side of the first terminal array and to which the joint conductor portions are electrically connected at a second array distance longer than the first array distance from the side of the second terminal array. Both the first array distance and the second array distance are defined herein to mean the average distance of the joint conductor portions. The terminal distance can be converted extremely simply by making difference the positions of the corresponding ones of the joint conductor portions connected to the upper and lower sides of the distance converting layers.

In this case, in the laminate, at least one layer of the first kind electrode conductor layers and at least one layer of the second kind electrode conductor layers can be individually used as the distance converting layers. As a result, the terminal distances can be easily converted in an independent manner while keeping the first side first kind terminals and the first side second kind terminals isolated in the DC current. In other words, the distances of the terminals of the individual kinds can be enlarged at different positions in the laminate direction by using the first kind electrode conductor layers for enlarging the distance of the joint conductor portions to electrically connect with the first side first kind terminals and by using the second kind electrode conductor layers for enlarging the distance of the joint conductor portions to electrically connect with the first side second kind terminals.

When the distances of the terminals of different kinds are to be made at the same positions in the laminate direction, through holes have to be formed in the electrode conductor layers of the first polarity (i.e., one of the first kind and the second kind), and the conductor layers of the second polarity (i.e., the other of the first kind and the second kind) have to be so arranged in the through holes with a relatively large area for increasing the terminal distance that they are spaced through dielectric members. These conductor layers of the second polarity are in the same polarity as that of the conductor layers adjoining through the dielectric layers so that they hardly contribute to the electrostatic capacity formation. On the other hand, the electrode conductor layers of the first polarity are in the polarity different from that of the conductor layers adjoining through the dielectric layers so that they play a main role for the electrostatic capacity formation. In order to arrange the conductor layers of the second polarity, however, the through holes have to be made large so that the effective electrode area is reduced to lower the electrostatic capacity.

If, however, the distances of the terminals of the individual different kinds are enlarged at the positions different from each other in the laminate direction, the conductor layers of the second polarity need not be mixed in the conductor layers of the first polarity at the common positions in the laminate direction, so that the drop of the electrostatic capacity can be prevented. More specifically, when the first kind electrode conductor layers and the second kind electrode conductor layers are defined such that the same kind electrode conductor layer closest on the side of the first terminal array with respect to the distance converting layer is a before conversion layer and such that the same kind electrode conductor layer closest on the side of the second terminal array is an after conversion layer, the joint positions of the joint conductor portions are made identical to each other in the in-plane direction between the before conversion layer and the distance converting layer and between the distance converting layer and the after conversion layer, and wherein the through holes for passing the joint conductor portions therethrough are formed in a mutually displaced positional relation in the two other kind electrode conductor layers, which are individually positioned between the before conversion layer and the distance converting layer and between the distance converting layer and the after conversion layer. Although the terminal distance conversions are performed, therefore, the through holes formed in the first kind electrode conductor layers and the second kind electrode conductor layers can be sized to have the necessary minimum area for passing the joint conductor portions therethrough, so that the influences of the electrostatic capacity drop due to the formation of the through holes can be eliminated as much as possible.

In the case of the aforementioned expanding conversions of the terminal distances, some of the group of the first kind electrode conductor layers and the second kind electrode conductor layers to be laminated on the second main surface side of the laminate can be given a larger area than the group of the first kind electrode conductor layers and the second kind electrode conductor layers to be laminated on the first main surface side by making use of the area difference between the first terminal array and the second terminal array. As a result, the electrostatic capacity of the capacitor can be further enhanced.

Moreover, not only the first side first kind terminals and the first side second kind terminals but also the signal terminals can be formed on the first main surface of the laminate. In this case, the signal terminals can be so electrically connected with the signal base side terminals formed on the second main surface of the plate-shaped base, through the signal joint conductor portions in the laminate and the signal base side joint conductor portions in the plate-shaped base that they do not conduct with the electrode layers in the thin film laminate. As a result, the signal lines can also be simultaneously made in the thin film laminate and can be formed while avoiding the capacitor portion so that they exert little influence upon the signal quality. In this case, it is desired for preventing the capacitance coupling between the plural signal lines and for less mismatch of the impedance of the signal lines that the dielectric layer covering the signal joint conductor portions in the thin film laminate is made of a material having a lower dielectric constant than that of the dielectric layer covering the electrode layer.

Next, such ones of the dielectric layers and the first kind and second kind electrode conductor layers, which make the laminate, as are laminated on the side of the first main surface can be dielectric thin films and first kind and second kind electrode conductor thin films having a thickness of 1.5 $\mu$m or less, respectively, so that a thin film capacitor can be formed by the dielectric thin films and the first kind and second kind electrode conductor thin films. In this thin film capacitor, the realizable electrostatic capacity can be drastically increased even with the small element size on the basis of the thin film effect of the dielectric layers. Moreover, the capacitor can be easily manufactured by simply repeating the patterning according to the photolithography technique and the general filming technique. This thin film capacitor can also be formed by laminating pluralities of dielectric layers and first and second kind electrode conductor layers. In this case, the joint conductor portions jointing the two same kind electrode conductor thin films to each other can be formed as the thin film portions which are integrated with at least either of the two same kind electrode conductor thin films.

In the aforementioned thin film capacitor, it is desired that the dielectric thin films have a thickness of 10 nm or more and 1,000 nm or less. If the thickness of the dielectric thin films is less than 10 nm, the isolation between the electrode conductor thin films in the DC current by the dielectric thin films is deteriorated to cause the leakage current seriously. If the thickness of the dielectric thin films is more than 1,000 nm, the merits of the small size and the large capacity intrinsic to the thin film capacitor are not prominent. The thickness of the dielectric thin films is more desired to be 30 nm or more and 500 nm or less. In case the electrode conductor thin films are exemplified by metallic thin films, their thickness is desired to be 10 nm or more and 500 nm or less. If the thickness of the metallic thin films making the electrode conductor thin films is less than 10 nm, the sheet resistance of the thin films rises so that the DC resistance component to be added in series to the capacitor formed becomes higher from the viewpoint of the equivalent circuit. These thin films may deteriorate the impedance reducing effects or may narrow the band width due to the formation of the RC series resonance circuit, in case they are used in the decoupling capacitor or the "passcon". Moreover, it may become a cause for raising the cost to use the electrode conductor thin films having a thickness of 500 nm or more. The thickness of the electrode conductor thin films is more desired to be 50 nm or more and 300 nm or less.

In the thin film capacitor, in order to reduce the inductance and prevent the increase in the DC resistance, the electrode conductor thin films of the same kind jointed at the joint conductor portions are desirably provided with a plurality of joint conductor portions for electrically connecting with the electrode conductor thin films on the same main surface side. In this case, such ones of the joint conductor portions as are of different kinds and closest to each other are desired to have an edge distance of 20 μm or more and 300 μm or less. If the edge distance is less than 20 μm, a short circuit easily occurs between the joint conductor portions of the different kinds to be isolated in the DC current. Moreover, it is difficult to fill the dielectric layers between the joint conductor portions so that a defect such as a cavity may occur. If the edge distance is more 300 μm, moreover, the increase in the DC resistance of the capacitor is easily invited. If the joint conductor portions of the different kinds are brought closer to 300 μm or less, on the other hand, the apparent inductance of the joint conductor portions can be reduced by the mutually inductive canceling effect between the opposite phase AC waves to flow through the joint conductor portions of the different kinds, so that the impedance of the capacitor can be more lowered. Here, the adoption of the photolithography technique in the third mode of the invention is advantageous in that the capacitor can be formed simply and highly precisely even in case it is used as the decoupling capacitor for an integrated circuit having a number of power terminals or ground terminals or in case the joint conductor portions are finely condensed to the aforementioned order of μm.

Moreover, it is desired that the different kind terminals closest to each other in the terminal array have an edge distance of 20 μm or more and 300 μm or less. In case the capacitor is used as the decoupling capacitor, one of the different kind terminals functions as the power terminals whereas the other acts as the ground terminals. By setting those two closer at an edge distance of 300 μm or less, the apparent inductance of the terminal portions can be reduced to make the impedance of the capacitor lower, by the mutually inductive canceling effect of the AC waveforms of reverse phases to flow through the different kind terminals.

In case the first main surface side of the laminate is to be made of the aforementioned thin film capacitor, on the other hand, it is desired that the different kind terminals closest to each other in the first terminal array have an edge distance of 20 μm or more and 300 μm or less. In case the capacitor is used as the decoupling capacitor, one of the different kind terminals functions as the power terminals whereas the other acts as the ground terminals. By setting those two closer at an edge distance of 300 μm or less, the apparent inductance of the terminal portions can be reduced to make the impedance of the capacitor lower, by the mutually inductive canceling effect of the AC waveforms of reverse phases to flow through the different kind terminals.

The electrode conductor thin films and the joint conductor portions, which construct the thin film capacitor, can be made of a metal such as Cu, Ag, Au or Pt and are efficiently formed by the vapor deposition method such as the sputtering or vacuum deposition method. On the other hand, the dielectric thin films and the dielectric hole filling portions are efficiently formed by the vapor deposition method such as the high-frequency sputtering, reactive sputtering or chemical solution deposition (CVD) method, in the case of an inorganic dielectric material such as an oxide or nitride. On the other hand, dielectric thin films can be formed, if made of an oxide family, by the chemical solution deposition (CSD) method such as the so-called "sol-gel filming method". This chemical solution deposition method forms the dielectric thin films by drying or firing the layer, to which the solution of the compound material making the dielectric thin films is applied, and is advantageous in that it can form the dielectric thin films more conveniently than the vapor deposition method. According to the sol-gel method, for example, the dielectric thin films (e.g., oxide thin films) are obtained by applying and drying a sol composite of an organic metal solution to the plate-shaped base and then by firing the dried composite.

In case a thin film capacitor of especially high electrostatic capacity is to be manufactured or in case the capacitor of that capacity is to be more small-sized, it is advantageous to use a dielectric material having a higher dielectric constant. For this purpose, it is desired that the dielectric thin films and the dielectric hole filling portions (are made of dielectric ceramics with high dielectric constant (as defined to have a specific dielectric constant of 50 or more: ferroelectric ceramics, for example). The dielectric ceramics with high dielectric constant is desirably made of a composite oxide having a perovskite type crystal structure, such as one kind or two kinds or more of barium titanate, strontium titanate or lead titanate. This ceramics has an especially high dielectric constant and is prepared relatively easily so that it can be properly adopted in third mode of the invention. Here, the dielectric thin films made of the dielectric ceramics with high dielectric constant invite a serious reduction in the dielectric constant, if its crystallinity is deteriorated, so that it is desirably constructed as crystal thin films. In case the vapor deposition method such as the sputtering method is adopted, the crystallization can be promoted if the filling is made by heating the plate-shaped base. In case the chemical solution deposition method such as the sol-gel method is adopted, the crystallization of the films can be promoted by the firing treatment after the drying step.

In the laminate constructing the capacitor of third mode of the invention, the thin film capacitor can be formed over the first main surface of a plate-shaped base (although the plate-shaped base will be handled to belong to the laminate). Specifically, first kind base side terminals or the second side first kind terminals and second kind base side terminals or the second side second kind terminals, which are isolated from each other in a DC current, are formed on the second main surface of the plate-shaped base, and the first kind base side terminals and the second kind base side terminals are individually electrically connected with the first kind electrode conductor thin film forming the first kind electrode conductor layer and the second kind electrode conductor thin film forming the first kind electrode conductor layer, which are closest to the second main surface of the thin film capacitor, respectively, through a base side joint conductor portions extending through the plate-shaped base in the thickness direction.

In the construction of JP-A-2003-142624, the thin film capacitor is formed on the silicon substrate, and the semiconductor element is mounted on the thin film capacitor. After this, the silicon substrate is peeled off to form into the thin film capacitor solely into the intermediate substrate. This construction is defective in that an additional step is required for peeling the silicon substrate, and in that the thin film capacitor having the substrate peeled does not have a high rigidity. In case the main substrate or the connection target is made of mainly of a polymer material such as the mother board or the organic package substrate acting as a second-stage intermediate substrate, the difference in the linear expansion coefficient between the semiconductor element and the main substrate cannot be absorbed if a thermal history such as the solder reflow is added. This may lead to a drawback such as the solder peel or the damage of the thin film capacitor due to shortage of rigidity. When the base side terminals and the base side joint conductor portions are made in the plate-shaped base for the filming base of the thin film laminate or the thin film capacitor so that the plate-shaped base is incorporated as the component of the intermediate substrate, the base peeling step can be dispensed with, and the rigidity of the intermediate substrate can be drastically improved to prevent the aforementioned defects effectively.

From the viewpoint of the improvement in the rigidity, the plate-shaped base may be made thicker than the thin film laminate having a low rigidity. The material for the plate-shaped base may be a polymer. It is, however, more desirable for preventing the solder peel or the like at the terminals that the substrate material is selected to reduce the expansion coefficient differences between the semiconductor element (of silicon, for example) and the intermediate substrate and between the intermediate substrate and the main substrate made mainly of the polymer material, and further to lower the level of the thermal shearing stress to be applied to the individual terminals formed on the two faces of the intermediate substrate at the solder reflow time or the like. The silicon has a linear expansion coefficient as low as 2 to 3 ppm/° C. from the room temperature to about 300 ° C. for the solder reflow. On the contrary, the polymer material such as epoxy resin composing the main substrate (e.g., the mother board or the organic package substrate) has a high linear expansion coefficient of 17 to 20 ppm/° C. The dielectric ceramics with high dielectric constant of the dielectric layer composing the thin film laminate has a relatively high linear expansion coefficient of 12 to 13 ppm/° C. in the case of the aforementioned perovskite type oxide. It is, therefore, effective for reducing the aforementioned linear expansion coefficient difference and to lighten the shearing stress to act on the terminals that the plate-shaped base is made of a ceramic material having a lower linear expansion coefficient. This ceramic material can be exemplified by alumina (7 to 8 ppm/° C.) or glass ceramics prepared by adding 40 to 60 wt. parts of inorganic ceramic filler such as alumina to borosilicate glass or borosilicate lead glass. Moreover, another ceramic material to be used is aluminum nitride, silicon nitride, mullite, silicon dioxide or magnesium oxide. From the viewpoint of similarity of the linear expansion coefficient to the semiconductor element, moreover, a material other than the ceramics can be silicon (although consideration has to be taken into the insulation from the capacitor assembled in the thin film laminate or a conductor portion electrically connecting with the capacitor).

Due to the aforementioned linear expansion coefficient difference, a relative displacement in an in-plane direction between the terminals may occur between the semiconductor element and the intermediate substrate and between the intermediate substrate and the main substrate. However, the relative displacement is constricted by the solder joint between the terminals so that the shearing stress is applied to the solder connection portion between the terminals. In this case, it is desired that the plate-shaped base making an essential portion of the intermediate substrate is made of a ceramic material having a higher Young's modulus than that of the dielectric ceramics with high dielectric constant making the dielectric thin films of the thin film capacitor. As a result, the rigidity of the plate-shaped base is enhanced so that the elastic deformation on the side of the plate-shaped base can be little even with a more or less linear expansion coefficient difference. As a result, the shearing deformation displacement to act on the solder connection portion is reduced so that the drawback such as the peel or disconnection of the connection portion hardly occurs.

On the other hand, the plate-shaped base can also be constructed of the laminated ceramic capacitor base, in which the fired ceramic dielectric layers and the electrode conductor layers co-fired with the fired ceramic dielectric layers are alternately laminated. As a result, the electrostatic capacity of the entire capacitor can be more increased by both the thin film capacitor and the fired type laminated ceramic capacitor made on the plate-shaped base side. Moreover, the parallel combination of the thin film capacitor having a relatively large capacity and a laminated ceramic capacitor having a smaller capacity can be realized with one element, and the impedance lowering effect can be retained over a wider frequency band. Here, the dielectric layer to be used in the laminated ceramic capacitor can also be constructed of normally dielectric ceramics. From the viewpoint of a higher capacity, however, the dielectric layer to be used in the laminated ceramic capacitor is desirably made of highly dielectric ceramic (e.g., the aforementioned perovskite type oxide layer).

BRIEF DESCRIPTION OF THE DRAWINGS

FIG. 3 presents a schematic top plan view and a sectional side elevation showing the capacitor of the invention of FIG. 1;

FIG. 5 is a schematic diagram showing a top plan mode of an electrode conductor thin film;

FIG. 12 presents a schematic top plan view and a sectional side elevation showing a sixth modification of the same;

FIG. 15-A is a sectional view showing a ninth modification of the same;

DETAILED DESCRIPTION OF THE INVENTION

Embodiments of the invention will be described with reference to the accompanying drawings.

Figure 1:
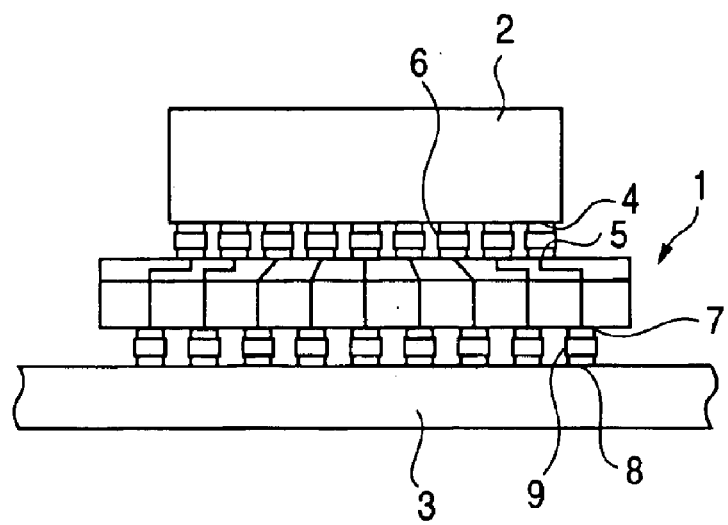
FIG. 1 is a schematic side elevation showing one example, in which a capacitor of the invention is constructed as an intermediate substrate.

FIG. 1 shows an example, in which a capacitor 1 (as will also be called the "intermediate substrate 1") according to one embodiment of the invention is constructed as an intermediate substrate 1 arranged between a semiconductor integrated circuit element 2 and a main substrate 3. In this embodiment, moreover, the first main surface of a plate-shaped member is located on the face appearing on the upper side of the drawing, and the second main surface is located on the face appearing on the lower side.

Figure 2:
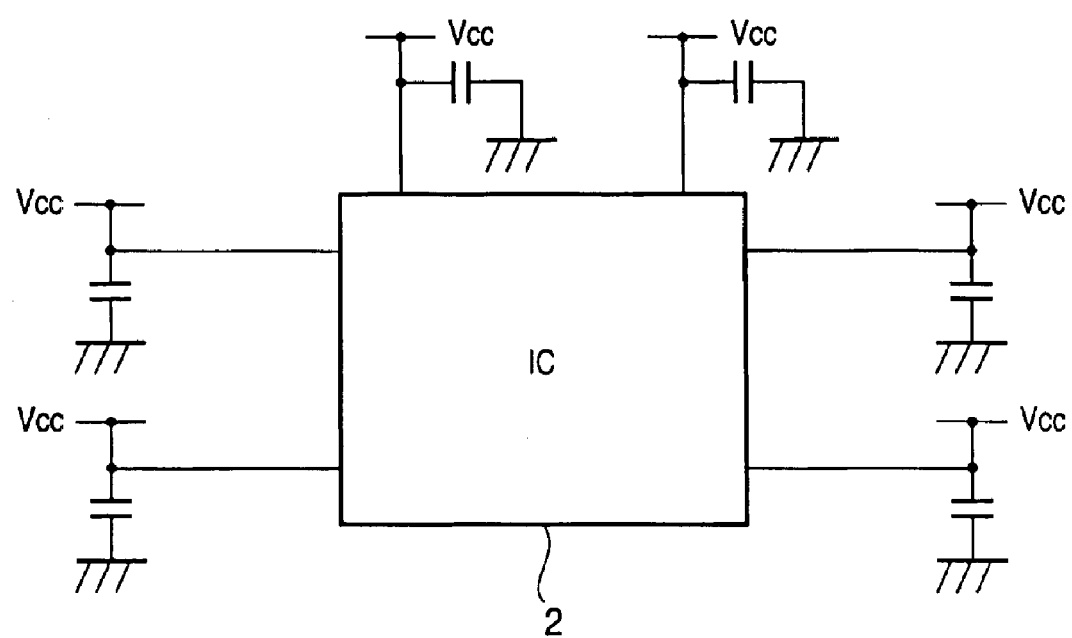
FIG. 2 is an equivalent circuit diagram showing one example of the mode of using a decoupling capacitor for an integrated circuit.

The semiconductor integrated circuit element 2 is provided on its second main surface with an element side terminal array 4 each including pluralities of signal terminals, power terminals and ground terminals, and is flip-chip connected through solder connection portions with a thin film laminate side terminal array 5 formed on the first main surface of the intermediate substrate 1. On the other hand, the main substrate 3 is an organic laminate package substrate making a mother board or a second-stage intermediate substrate, either of which is made mainly of a polymer material prepared by intensifying ceramic particles or fibers as a filler. In a main substrate side terminal array 8 made of solder balls or metal pins, the main substrate 3 is connected through the solder connection portion 9 with a base side terminal array 7 formed on the second main surface of the intermediate substrate 1. The capacitor 1 making the intermediate substrate functions as a decoupling capacitor to be connected in parallel with the power line of the semiconductor integrated circuit element 2, as shown in FIG. 2. Here, the equivalent circuit of FIG. 2 is shown to have independent decoupling capacitors for every power lines. However, all these decoupling capacitors are connected in parallel between the power lines at the same voltage and the ground. The following embodiments will be described by representing them by the construction, in which the decoupling capacitors are shared as a single capacitor among the power lines (although not limited thereto).

As shown in FIG. 3, the capacitor 1 has a structure including a plate-shaped base 50 and a thin film laminate 10 jointed to the first main surface of the plate-shaped base 50 thereby to construct the thin film capacitor. On the first main surface of the thin film laminate 10, there are arranged in a staggered grid shape (or in a staggered shape) first kind terminals 5a and second kind terminals 5b, either of which are used as the power terminals whereas the others are used as the ground terminals thereby to form the thin film laminate side terminal array 5. On the second main surface of the plate-shaped base 50, there are also arranged in such a staggered grid shape (or in a staggered shape) first kind base side terminals 7a and second kind base side terminals 7b as correspond to the terminal array of the thin film laminate side terminal arrays 5. These first and second kind base side terminals 7a and 7b form the base side terminal array 7. Here, both the arrays 5 and 7 have pluralities of signal terminals 5s and signal base side terminals 7s in a shape to enclose the grid-shaped arrays of the power terminals and the ground terminals.

Figure 4:
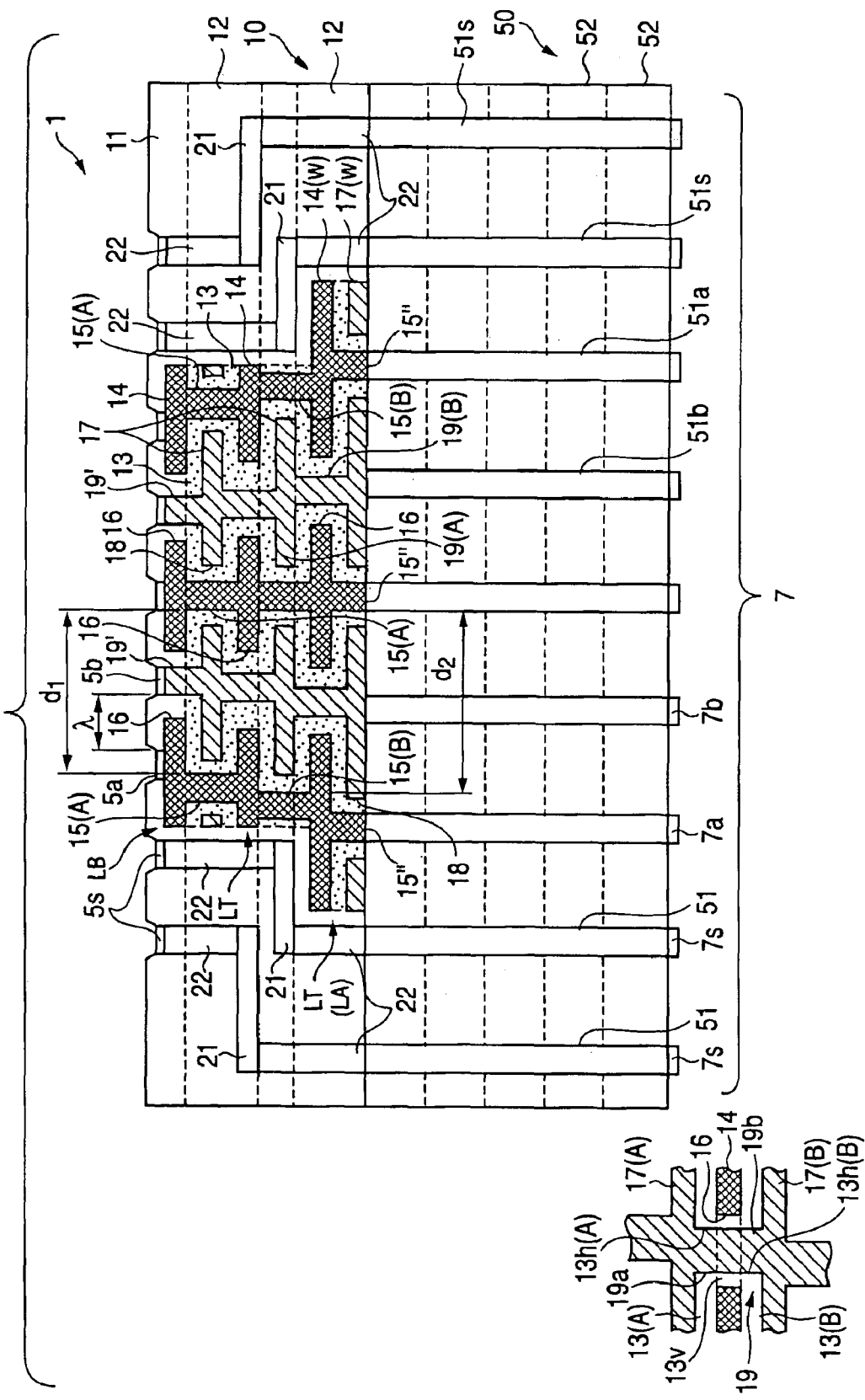
FIG. 4 is a sectional view showing a detailed structure of the capacitor of FIG. 3.

FIG. 4 shows a detailed structure of the capacitor (or the intermediate substrate) 1.

The thin film laminate 10 is formed by alternately laminating a plurality of dielectric thin films 13 formed the capacitor and pluralities of electrode conductor thin films 14 and 17. On the first main surface of the thin film laminate 10, the first king terminals 5a and the second kind terminals 5b are formed and isolated from each other in the DC current. Of the electrode conductor thin films 14 and 17, the first kind electrode conductor thin films 14 electrically connecting with the first kind terminals 5a and the second kind electrode conductor thin films 17 are so laminated alternately in the laminate direction that they are spaced by the dielectric thin films 13.

On the other hand, the first kind base side terminals 7a and the second kind base side terminals 7b on the side of the plate-shaped base 50 are jointed through joint conductor portions 15 and 19 on the side of the thin film laminate 10, respectively, to the first kind electrode conductor thin film 14 and the second kind electrode conductor thin film 17, which are closest to the second main surface of the thin film laminate 10. This structure allows the power terminals and the ground terminals (of the array 4) on the side of the semiconductor integrated circuit element 2 (FIG. 1) constructed of the silicon integrated circuit chip or the like to be connected through solder with the first kind terminals 5a and the second kind terminals 5b formed on the first main surface of the thin film laminate 10, as shown in FIG. 1. Moreover, the power terminals and the ground terminals (of the array 8) on the side of the main substrate 3 can be connected, respectively, with the first kind base side terminals 7a and the second kind base side terminals 7b on the side of the second main surface of the plate-shaped base 50. Thus, the capacitor 1 can function as the intermediate substrate, which is positioned at an intermediate position between the semiconductor integrated circuit element 2 and the main substrate 3 thereby to intervene the connections of the two.

Between one same kind electrode conductor thin film (or the second kind electrode conductor thin film) 17(A) and the other same kind electrode conductor thin film 17(B) adjoining in the laminate direction, as shown partially in an enlarged scale in FIG. 4, a first dielectric thin film 13(A), the other kind electrode conductor thin film (or the first kind electrode conductor thin film) 14 and a second dielectric thin film 13(B) are laminated in the recited order. A first through hole 13h(A) formed in the first dielectric thin film 13(A) and a second through hole 16 formed in the other kind electrode conductor thin film 14 overlap in an in-plane projection, and the second through hole 16 and a third through hole 13h(B) formed in the second dielectric thin film 13(B) overlap in an in-plane projection (although these through holes are coaxially arranged in the illustrated portion by circular sections). Moreover, the joint conductor portion 19 for jointing one same kind electrode conductor thin film 17(A) and the other same kind electrode conductor thin film 17(B) is formed to fill the first through hole 13h(A) and the third through hole 13h(B). In the second through hole 16, moreover, the outer circumference of the joint conductor portion 19 and the inner circumference of the second through hole 16 are isolated in the DC current by a dielectric hole filling portion 13v, which is integrated individually with (or jointed to) the first dielectric thin film 13(A) and the second dielectric thin film 13(B). In the structure thus far described, there is likewise formed the structure portion, in which the first kind electrode conductor thin film 14 and the second kind electrode conductor thin film 17 are reversed. In this embodiment, a first joint conductor thin film portion 19$a$ is protruded from one same kind electrode conductor thin film 17(A), and a second joint conductor thin film portion 19$b$ is protruded from the other same kind electrode conductor thin film 17(B), so that the first joint conductor thin film portion 19$a$ and the second joint conductor thin film portion 19$b$ are jointed in the second through hole 16 to each other thereby to form the integral joint conductor portion 19 (although the leading end of the joint conductor portion protruded from one same kind electrode conductor thin film may be directly jointed to the other same kind electrode conductor thin film).

The electrode conductor thin films 14 and 17 are multi-layered to enlarge the total areas, and the dielectric layers are thinned, so that even the realizable electrostatic capacity can be drastically increased even with the small element size. The electrode conductor thin films 14 and 17 look as if they are separated in the in-plane direction by illustrating the through holes 16 and 18, as shown in FIG. 4. As a matter of fact, however, the thin films are continuous in the in-plane direction at portions other than the through holes 16 and 18, as shown in FIG. 5. This continuity likewise applies to the dielectric thin films 13.

The dielectric thin films 13 have a thickness of 10 nm or more and 1,000 nm or less, for example, more desirably, 30 nm or more and 500 nm or less. On the other hand, the electrode conductor thin films 14 and 17 have a thickness of about 10 nm or more and 500 nm or less, for example, more desirably 50 nm or more and 500 nm or less. The electrode conductor thin films 14 and 17 and the joint conductor portions 15 (19) can be made of a metal such as Cu, Ag, Au or Pt, for example, and is formed by the vapor deposition method such as the sputtering or vacuum deposition method. On the hand, the dielectric thin films 13 and the dielectric hole filling portions 13$v$ are made of an inorganic dielectric substance such as an oxide or nitride and is formed by the vapor deposition method such as a high-frequency sputtering, a reactive sputtering or chemical vapor deposition (CVD) method. In this embodiment, the dielectric thin films 13 and the dielectric hole filling portions 13$v$ are formed by the sol-gel method using the oxide thin films which are made of one kind or two kinds or more of composite oxides having a perovskite type crystal structure, such as barium titanate, strontium titanate and lead titanate.

In order to prevent the DC resistance increase, the same kind electrode conductor thin films 14 (17) to be jointed at the joint conductor portions 15 (19) provided for each of the electrode conductor thin films 14 (17) with a plurality of joint conductor portions 15 (19) electrically connecting with the electrode conductor thin films 14 (17) on the same main surface side. Specifically, the joint conductor portions 15 (19) are dispersedly formed in the same number as the individual terminals of the thin film laminate side terminal array 5. The plural joint conductor portions 15 (19) are so set, even if of difference kinds, that their closest ones have an edge distance of 20 $\mu$m or more and 300 $\mu$m or less.

The first kind terminals 5$a$ and the second kind terminals 5$b$ in the thin film laminate side array 5 are jointed in the layer thickness direction either directly (on the side of the first kind electrode conductor thin films 14 in this embodiment) or through auxiliary joint conductor portions 19' (on the side of the second kind electrode conductor thin films 17 in this embodiment) to the first kind electrode conductor thin film 14 and the second kind electrode conductor thin film 17, which are located closest to the first main surface. On the other hand, the edge distance between the first kind terminal 5$a$ and the second kind terminal 5$b$ the most adjacent to each other is set to 20 $\mu$m or more and 300 $\mu$m or less. Either of these terminals of the different kinds function as the power terminals whereas the others function as the ground terminals, in case they are used in the decoupling capacitor 1. By bringing those two close to 300 $\mu$m or less in the edge distance, however, the apparent inductance can be reduced by the canceling effect of the AC waveforms of the opposite phases to flow through the terminals of the different kinds. In addition, contribution can be made to a lower impedance of the capacitor 1. Similar effects also occur between the adjoining joint conductor portions 15 and 19.

The capacitor 1 makes the base side terminals 7$a$, 7$b$ and 7$s$ and base side joint conductor portions 51$a$, 51$b$ and 51$s$ in the plate-shaped base 50 for the filming base of the thin film laminate 10 acting as the thin film capacitor, and introduces the plate-shaped base 50 as the component of the intermediate substrate. Therefore, the base peeling step, as disclosed in JP-A-2003-142624, can be dispensed with, and the rigidity of the intermediate substrate is drastically improved. Specifically, the plate-shaped base 50 is made thicker (e.g., 100 $\mu$m or more and 2 mm or less) than the thin film laminate 10, and alumina or glass ceramics is adopted as its material in this embodiment. This material has a linear expansion coefficient intermediate between that of the silicon making the semiconductor integrated circuit element 2 and that of the polymer material mainly composing the main substrate 3, and has a higher Young's modulus than that of the dielectric ceramics with high dielectric constant making the dielectric thin films 13.

Next, in the capacitor (or the intermediate substrate) 1 of this embodiment, the terminal array pitch of the base side terminal array 7 is set larger than that of the thin film laminate side terminal array 5. On the first main surface of the plate-shaped base 50, the individual end portions of the first kind base side joint conductor portions 51$a$ electrically connecting with the first kind base side terminals 7$a$ and the second kind base side joint conductor portions 51$b$ electrically connecting with the second kind base side terminals 7$b$ are arrayed at a larger distance (on an average) than that of the thin film laminate side terminal array 5. In this case, the terminal distance in the capacitor 1 has to be converted so that the narrow terminal distance on the side of the thin film laminate side terminal array 5 may match the terminal array of the wider base side terminal array 7.

In this embodiment, on the second main surface of the thin film laminate 10 (or on the first main surface of the plate-shaped base 50), the first kind base side joint conductor portions 51$a$ and the second kind base side joint conductor portions 51$b$ are arrayed at a larger distance than the thin film laminate side terminal array 5, and are jointed in the laminate direction either directly (on the side of the first kind electrode thin film conductors 14 in this embodiment) or through auxiliary joint conductor portions 15" (on the side of the second electrode thin film conductors 17 in this embodiment), respectively, to the first kind electrode thin film conductor 14 and the second kind thin film conductor 17, which are located closest to the second main surface of the thin film laminate 10. In the structure thus far described, on the second main surface of the thin film laminate 10 (or on the first main surface of the plate-shaped base 50) providing the boundary with the thin film laminate 10, the terminal distance is so converted in the thin film laminate 10 that the distances of the first terminal joint conductor portions 15 and the second terminal joint conductor portions 19 may match the large distances of the base side joint conductor portions 51a and 51b.

As shown in FIG. 4, more specifically, all the individual electrode conductor thin films 14 and 17 excepting at least one layer, i.e., the uppermost layer in this case are distance converting thin films (LT). In these distance converting thin films LT, the electrode conductor thin films 14 and 17 are connected at a first array distance d1 from the side of the thin film laminate side terminal array 5 with joint conductor portions 15(A) (19(A)), and at a second array distance d2 larger than the first one d1 from the side of the base side terminal array 7 with joint conductor portions 15(B) (19(B)). In short, the distance converting thin films LT make the connection positions of the upper and lower joint conductor portions 15 (19) different from each other thereby to realize the conversion of the terminal distances. Moreover, the electrode conductor thin films 14 and 17 constructing the capacitor 1 are utilized as the distance converting thin films LT so that the leading wiring portions for converting the terminal distances, as disclosed in JP-A-2003-142624, need not be formed on the first main surface side of the thin film laminate 10 to be electrically connected with the semiconductor integrated circuit element. Thus, the inductance of the capacitor terminal portions can be drastically lowered. Here, the array distances of the joint conductor portions 15(A) (19(A)) and the joint conductor portions 15(B) (19(B)) to be connected above and below the distance converting thin films LT can be designed on the basis of the equal distance array, for example. However, the local distance change may be made so as to avoid the interference with the joint conductor portions of the different polarity, and the final array distances may not always be equal. Taking this case into consideration, the aforementioned first array distance d1 and second array distance d2 are expressed by an average of the individual edge distances of the plural joint conductor portions. Let the case be considered, in which the array distance before the conversion is distributed within a range of 100 μm or more and 200 μm or less and in which the array distance after the conversion is distributed within a range of 150 μm or more and 300 μm or less. It is then sufficient that the second array distance d2 expressed in an average be larger than the first array distance d1 in an average, even if the array distances before and after the conversion have an overlapping range.

In FIG. 4, both the first kind electrode conductor thin films 14 and the second kind electrode conductor thin films 17 are individually utilized as the distance converting thin films LT. The first kind electrode conductor thin films 14 are used for enlarging the distances of the joint conductor portions 15 electrically connecting with the first kind terminals 5a, and the second kind electrode conductor thin films 17 are used to enlarge the distances of the joint conductor portions 19 electrically connecting with the second kind terminals 5b.

Figure 10:
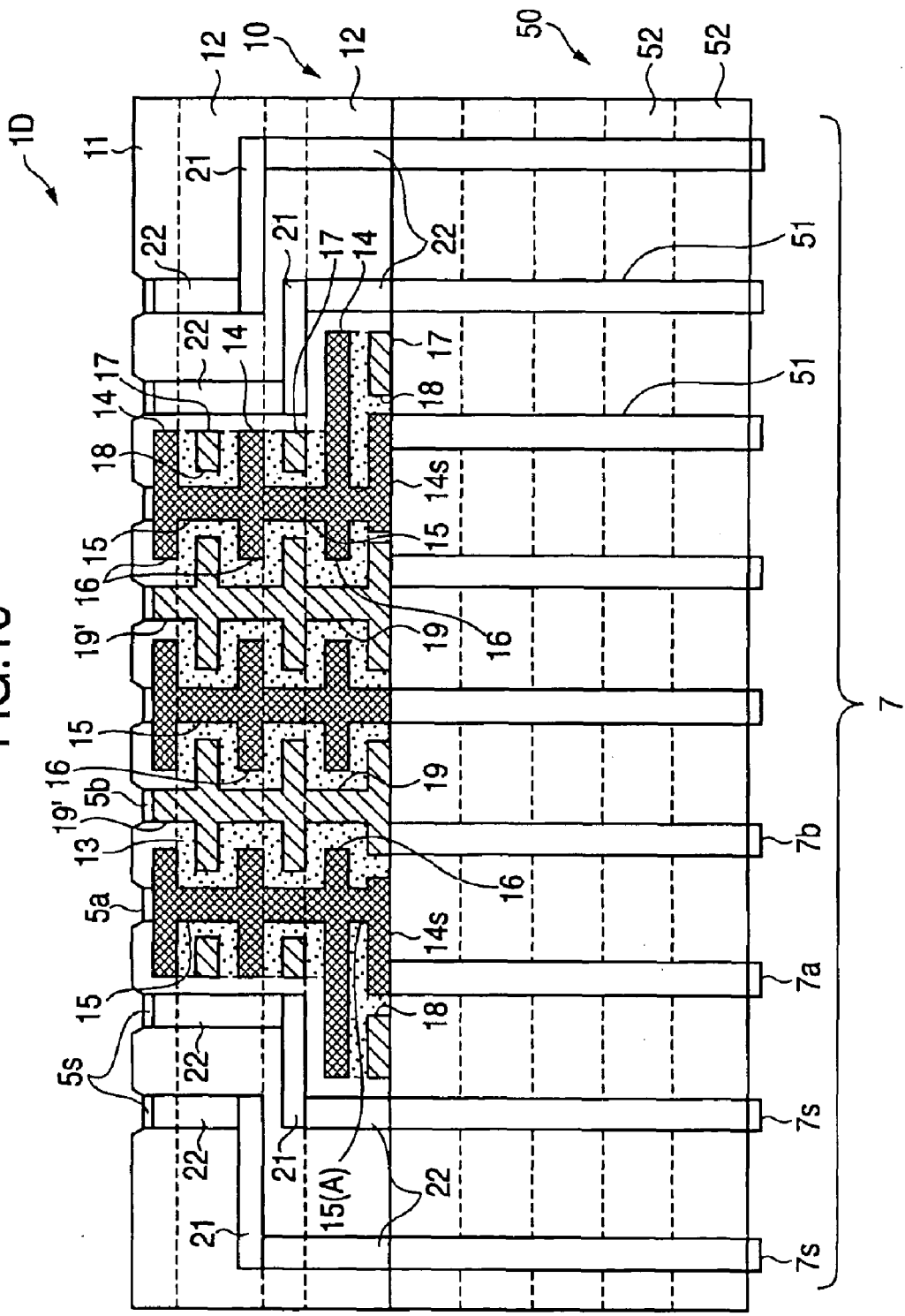
FIG. 10 is a sectional view showing a fourth modification of the same.

In a modification of FIG. 10, for example, the distances of the terminals of different kinds are enlarged as a whole at the same positions in the laminate direction in the thin film laminate 10, that is, at the forming positions of the second kind electrode conductor thin film 17 of the lowermost layer in FIG. 10. In this construction, the large through holes 18 spaced by the dielectric members 13 are formed in the second kind electrode conductor thin films 17 for the first polarity, and auxiliary conductor thin films 14s of the second polarity (i.e., the same polarity as that of the first kind electrode conductor thin films 14) are so arranged in those through holes 18 as to have a relatively large area for expanding the terminals. The auxiliary conductor thin films 14s are at the same polarity as that of the first kind electrode conductor thin films 14 adjoining through the dielectric thin films 13, so that they hardly contribute to the electrostatic capacity formation. As a result, the second kind electrode conductor thin films 17 to play a main role for forming the electrostatic capacity are so largely cut off with the through holes 18 as to arrange the auxiliary conductor thin films 14s so that the effective electrode area is reduced to lower the electrostatic capacity.

If, however, the distances of the joint conductor portions corresponding to the terminals of the individual kinds are enlarged at the positions different in the laminate direction in the thin film laminate 10, as shown in FIG. 4, the auxiliary conductor thin films of the different polarities having no contribution to the electrostatic capacity formation need not be mixed at the same position in the laminate direction, so that the electrostatic capacity can be prevented from becoming lower. If the same kind electrode conductor thin film 14 closest to the side of the thin film laminate side terminal array 5 with respect to the distance converting thin films LT is defined as a before conversion thin film LB and if the same kind electrode conductor thin film 14 closest to the side of the base side terminal array 7 is defined as an after conversion thin film LA, the joint positions of the individual joint conductor portions 15 (19) are coincident to each other in the in-plane direction between the before conversion thin films LB and the distance converting thin films LT and between the distance converting thin films LT and the after conversion thin films LA. In the two other kind electrode conductor thin films 17 and 17 positioned between the thin films, on the other hand, the second through holes 16 and 16 for passing the joint conductor portions 15(A) and 15(B) therethrough are formed with an offset from each other, in accordance with the conversions from the first array distance d1 to the second array distance d2 through the distance converting thin films LT. This makes the auxiliary conductor thin films 14s, as shown in FIG. 10, absolutely unnecessary. As a result, even with the distance conversions of the joint conductor portions, the through holes 16 and 18 to be formed in the first kind electrode conductor thin films 14 and the second kind electrode conductor thin films 17 can be reduced to the minimum area necessary for passing the joint conductor portions 15 and 19 therethrough, so that the influences of the reduction in the electrostatic capacity due to the formation of the through holes can be eliminated as much as possible.

Figure 11:
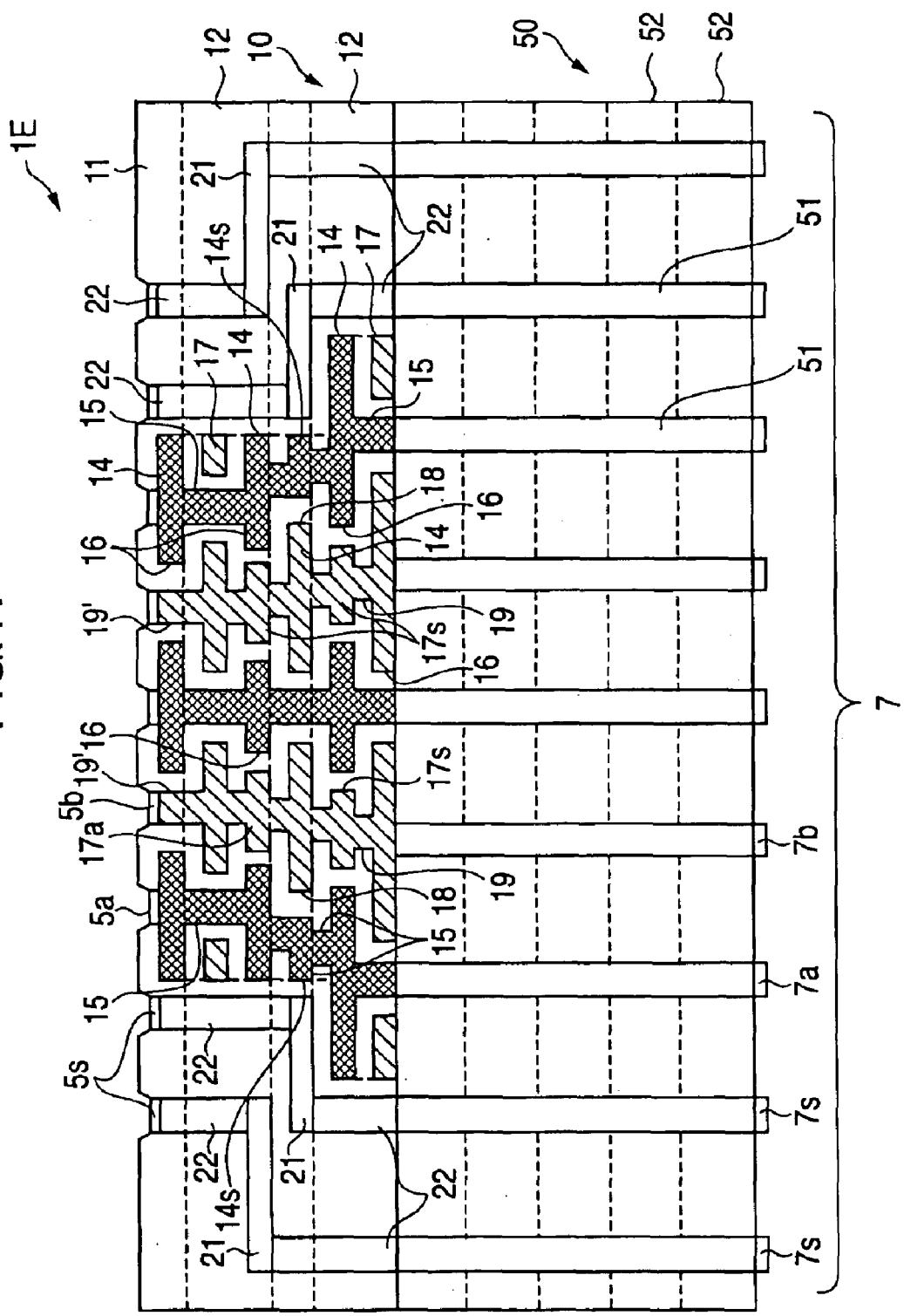
FIG. 11 is a sectional view showing a fifth modification of the same.

If the terminal distance conversions are to be made all at once in a few layers, as shown in FIG. 10, even in case the auxiliary conductor thin films are used, the area of the auxiliary conductor thin films 14s to be formed in those layers must become extremely large to lower the electrostatic capacity seriously. Therefore, the auxiliary conductor thin films 14s and 17s are dispersed and arranged in the individual layers of the first kind electrode conductor thin films 14 and the second kind electrode conductor thin films 17, as shown in FIG. 11. Then, the ranges of the distance conversions to be borne on the individual auxiliary conductor thin films become so short that the DC separating clearances between the joint conductor thin film portions 15 and 19 in the through holes 16 and 18 can be confined within the areas of little deviation. As a result, it is possible to suppress the reduction in the electrostatic capacity. In a portion of the structure illustrated in an enlarged scale in FIG. 4, the first through hole 13h(A) formed in the first dielectric thin film 13(A) and the second through hole 16 formed in the other kind electrode conductor thin film 14 have an overlap in an in-plane projection between one same kind electrode conductor thin film 17(A) and the other same kind electrode conductor thin film 17(B) adjoining in the laminate direction. Moreover, the second through hole 16 and the third through hole 13h(B) formed in the second dielectric thin film 13(B) has an overlap in the in-plane projection. In the constructions of FIG. 10 and FIG. 11, however, the aforementioned three through holes are not necessarily arranged coaxially.

Reverting to FIG. 4, the capacitor 1 of this embodiment performs the expanding conversion of the terminals distances so that the base side terminal array 7 has a larger area than that of the thin film laminate side terminal array 5. By making use of this area difference, therefore, a portion of the group of the first kind electrode conductor thin films 14 and the second kind electrode conductor thin films 17 to be laminated on the side of the second main surface of the thin film laminate 10, that is, the two lowermost layers 14(W) and 17(W) are given a larger area than the group of the first kind electrode conductor thin films 14 and the second kind electrode conductor thin films 17 to be laminated on the side of the first main surface. This makes it possible to increase the electrostatic capacity of the capacitor 1 more.

Figure 7:
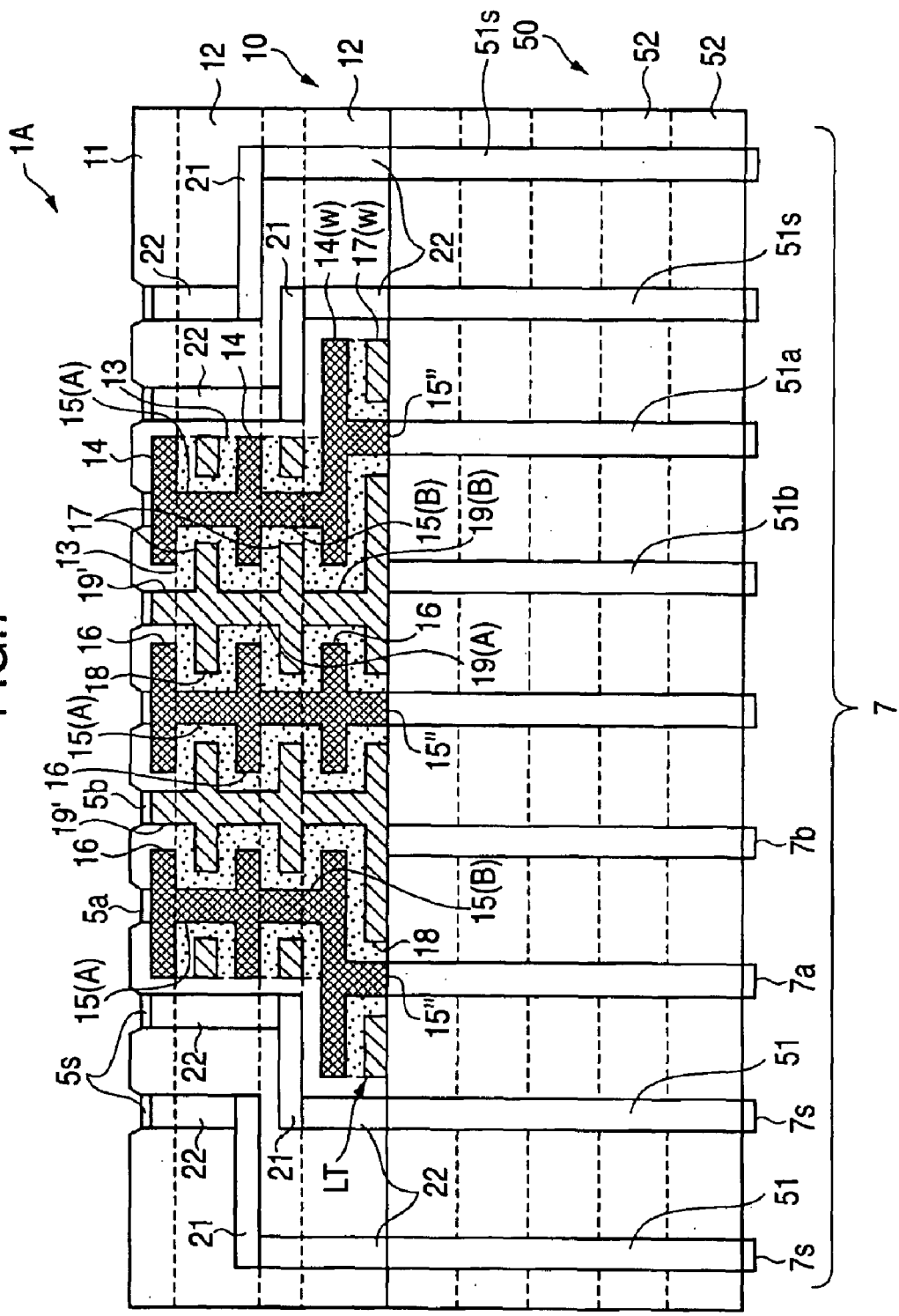
FIG. 7 is a sectional view showing a first modification of the capacitor of FIG. 4.

Here, the first kind electrode conductor thin films 14 and the second kind electrode conductor thin films 17 can also be changed for their individual layers into the distance converting thin films LT. In this case, the distance conversions of the upper and lower joint conductor portions 15 and 15" and 19 and 51b increase in the distance converting thin films LT. However, what changes is the positions to form the through holes 16 and 18 so that the effective area of the electrodes is hardly influenced to cause no substantial reduction in the electrostatic capacity. In FIG. 7, the distance conversions can be highly retained so that the group (i.e., the two lowermost layers 14(W) and 17(W)) of the first kind electrode conductor thin films 14 and the second kind electrode conductor thin films 17 widened are used as the distance converting thin films LT and LT.

On the first main surface of the thin film laminate 10, as reverting to FIG. 4, not only the first kind terminals 5a and the second kind terminals 5B but also the aforementioned signal terminals 5s are so formed in plurality that the outer peripheral area of the thin film laminate side terminal array 5 is assigned thereto. These signal terminals 5s are so connected to the signal substrate side terminals 7s formed on the second main surface of the plate-shaped base 50 through the signal joint conductor portions 22 in the thin film laminate 10 and the signal base side joint conductor portions 51s in the plate-shaped base 50 that they are not conductive with the electrode conductor thin films 14 and 17 in the thin film laminate 10 (around the electrode conductor thin films 14 and 17 outward in the in-plane direction in this embodiment). Moreover, a dielectric layer 12 (as will be called the "auxiliary dielectric layer") for covering the signal joint conductor portions 22 in the thin film laminate 10 is made of a material (e.g., silicon dioxide in this embodiment) of a lower dielectric constant than that of the dielectric layers 13 covering the electrode conductor thin films 14 and 17.

In FIG. 4, the thin film laminate side terminal array 5 is so formed as is enclosed in the projection relation by the base side terminal array 7, so that the terminals positioned at the outer side of the array have the larger positional displacement between the corresponding terminals as the arrangement distance becomes the longer. Therefore, the signal terminals 5s to be arranged in the outer peripheral area of the thin film laminate side terminal array 5 have to retain long leading wiring portions to be formed in the in-plane direction in the thin film laminate 10 so that they may be electrically connected with the corresponding signal base side terminals 7s. In the embodiment of FIG. 4, the terminal distance conversions from the thin film laminate side terminal array 5 to the base side terminal array 7 are set at a relatively large value. Therefore, the two wiring portions 21 and 21 of the signal terminals 5s positioned on the inner side are formed in the layers different from each other so that they may not interfere in the in-plane direction with the leading wiring portion 21 of the signal terminals 5s on the outer side.

Figure 8:
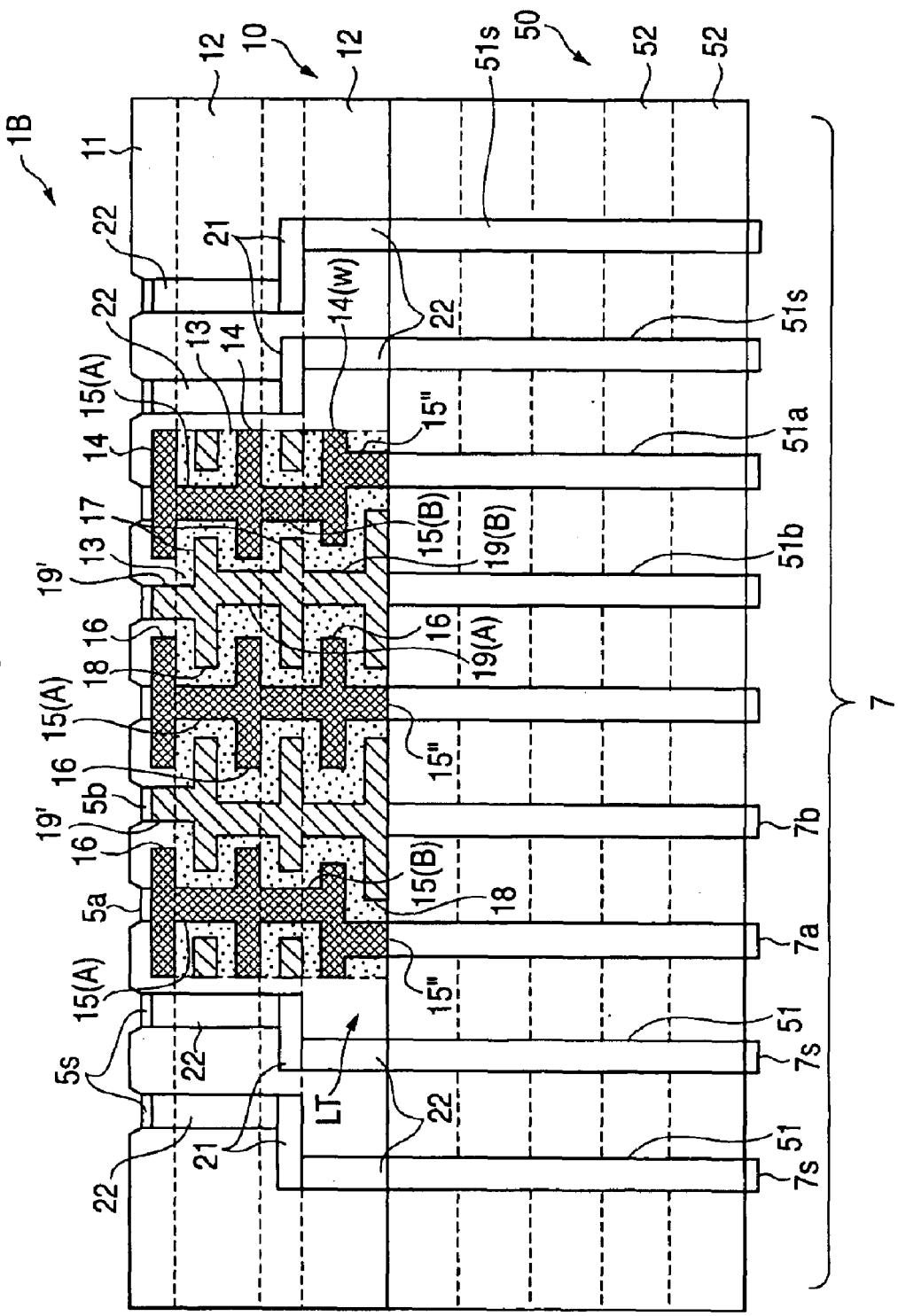
FIG. 8 is a sectional view showing a second modification of the same.
Figure 9:
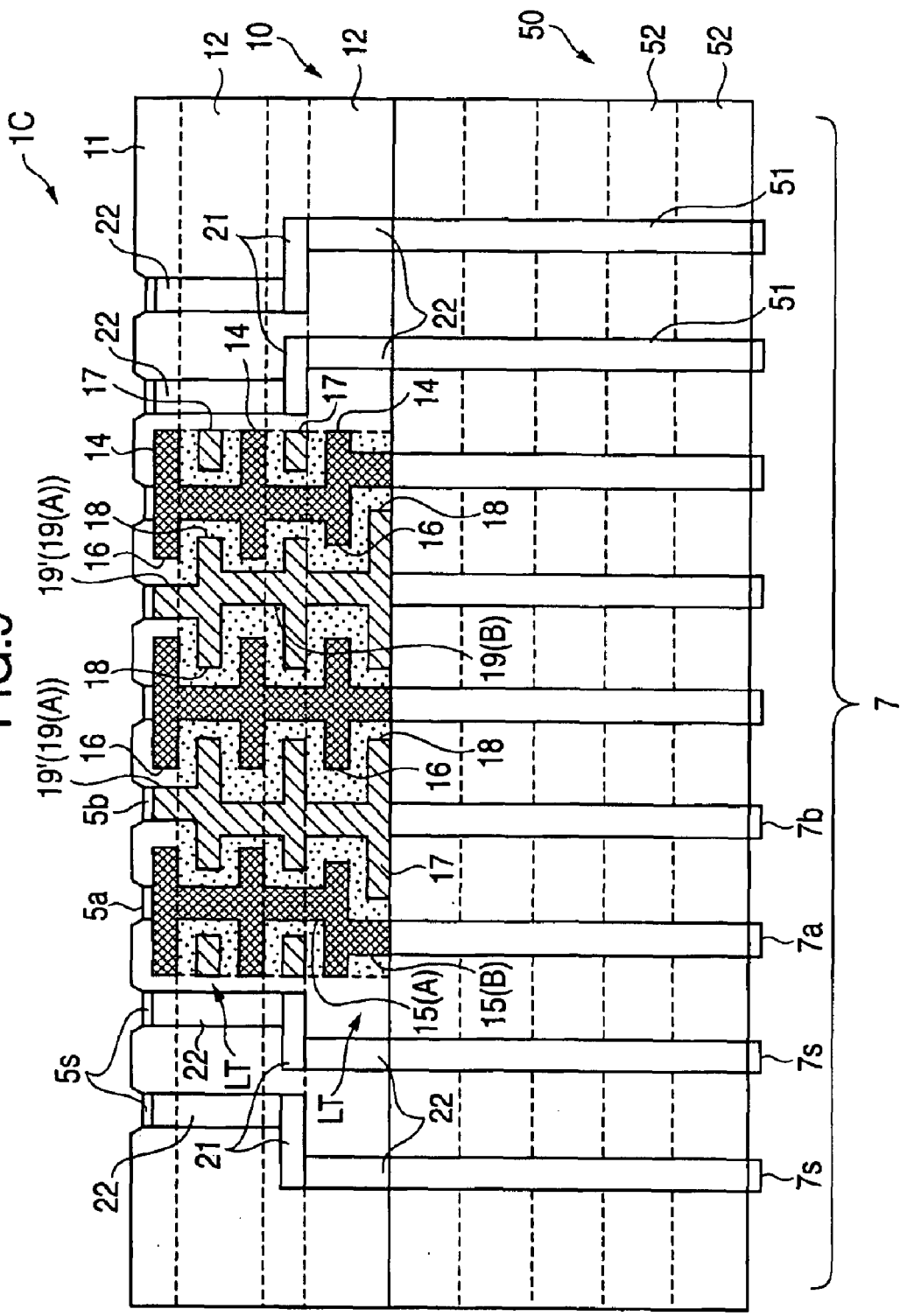
FIG. 9 is a sectional view showing a third modification of the same.

In case the terminal distance conversions are not so large, on the other hand, the leading wiring portions 21 of the inner and outer signal terminals 5s can be formed in the same layer, as shown in FIG. 8 and FIG. 9. In FIG. 8 and FIG. 9, moreover, the terminal distance conversions are relatively small so that all the electrode conductor thin films 14 and 17 are formed with the same area. In case the first kind electrode conductor thin films 14 and the second kind electrode conductor thin films 17 are partially used as the distance converting thin films LT and LT, on the other hand, what thin film is to be set as the distance converting thin films LT and LT is arbitrary. For example, one group of the lowermost layers is used as the distance converting thin films LT and LT in FIG. 8, and the lowermost first kind electrode conductor thin film 14 and the uppermost second kind electrode conductor thin film 17 are used as the distance converting thin films LT and LT in FIG. 9. In the embodiment thus far described, the signal terminals 5s are formed in such a shape as to assign the outer peripheral area of the thin film laminate side terminal array 5. In order to enhance the shielding properties of the signal lines thereby to suppress the crosstalk, however, the signal terminals 5s (and the signal lines conducting therewith) can be enclosed by the ground terminals (and the ground lines conducting therewith).

Figure 13:
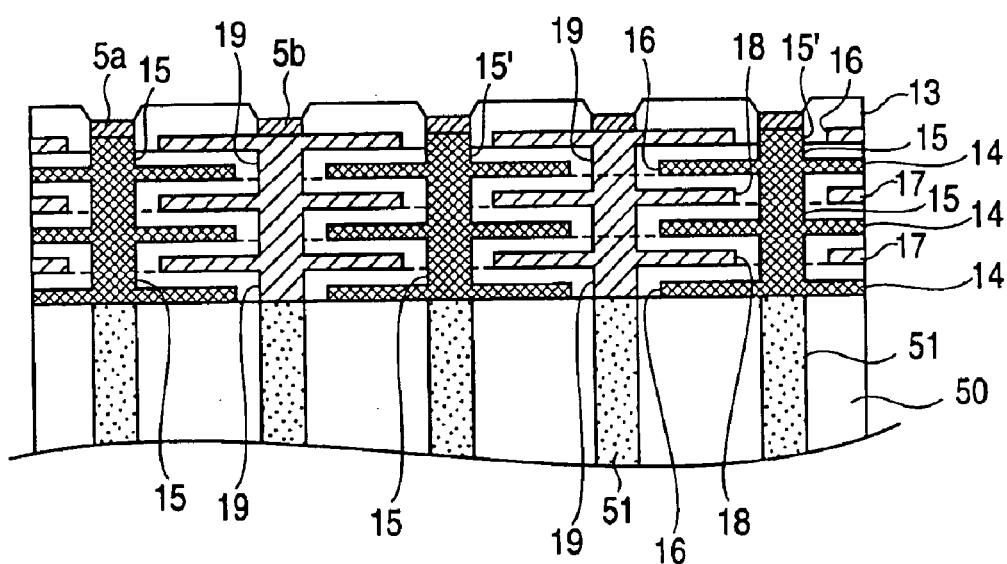
FIG. 13 is a sectional schematic diagram showing an essential portion of FIG. 12 in an enlarged scale.

As shown in FIG. 12, moreover, it is possible to equalize the terminal array pitch between the thin film laminate side terminal array 5 and the base side terminal array 7. In this case, the distance converting thin films LT and LT are not formed, as shown in FIG. 13. In this case, the length of the signal lines to pass through the thin film laminate 10 is equal to the thickness of the thin film laminate and is sufficiently shorter than the signal wavelength. Even if the dielectric layers (including the portions to cover the signal lines) of the thin film laminate 10 are wholly made of dielectric ceramics with high dielectric constant with those dimensions, this construction hardly exerts influences on the signal quality but contributes to the reduction in the manufacture cost. In FIG. 4, on the other hand, the first kind terminals 5a are connected directly with the first kind electrode conductor thin films 14, and the second kind terminals 5b are electrically connected with the second kind electrode conductor thin films 17 through the auxiliary joint conductor portions 19'. In the structure of FIG. 13, however, the first kind terminals 5a are electrically connected with the first kind electrode conductor thin films 14 through auxiliary joint conductor portions 15', and the second kind terminals 5b are connected directly with the second kind electrode conductor thin films 17.

Figure 6:
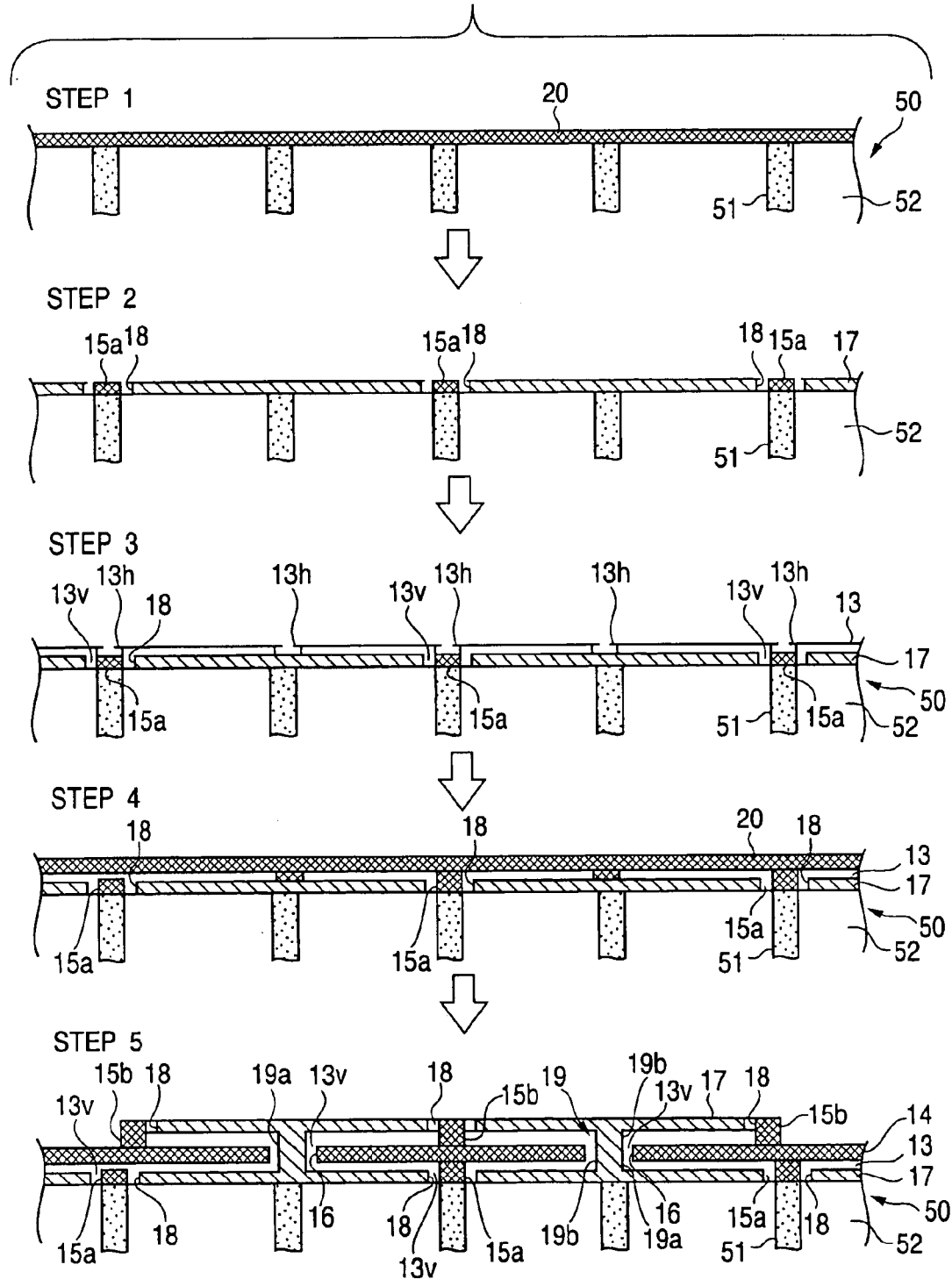
FIG. 6 presents step diagrams showing one example of a process for manufacturing the capacitor of FIG. 4.

The capacitor 10 thus constructed can be manufactured, for example, according to the steps shown in FIG. 6. At first, there is prepared the plate-shaped base 50, in which the aforementioned base side joint conductor portion 51 is formed as laminate vias by laminating and firing the well-known ceramic green sheet containing the material powder of ceramics to construct the base and the via holes formed by the punching or laser perforating method and filled with metallic powder paste. At the individual base side joint conductor portions 51, the base side terminals 7a, 7b and 7s (as referred to FIG. 4) are formed beforehand by the plating method on the second main surface side of the plate-shaped base 50.

Next, at Step 1, a metallic thin film 20 is formed on the first main surface of the plate-shaped base 50. The process then advances to Step 2, at which the formed metallic thin film 20 is etched at the joints to the unnecessary joint conductor thin film portions by using the photolithography method so that the first kind electrode conductor thin film 14 and the second kind electrode conductor thin film 17 may isolate each other in the DC current. In case the metallic thin film 20 is formed into the second kind electrode conductor thin film 17, for example, the joint conductor thin film portion (i.e., a first joint conductor thin film portion 15a at Step 2 of FIG. 6) to become conductive with the first kind electrode conductor thin film 14 is etched therearound in a donut shape to form the through holes 18 while leaving the metallic thin film 20 on the inner side as the first joint conductor thin film portions 15a for the first kind electrode conductor thin film 14 (at Step A). In other words, the donut shape is etched off to form the through holes 18 while leaving the joint conductor thin film portions 15a for electrically connecting with the base side joint conductor portions. In case the metallic thin film 20 is formed into the first kind electrode conductor thin film 14, on the other hand, the joint conductor thin film portion to become conductive with the second kind electrode conductor thin film 17 is etched therearound in the donut shape to form the through holes 16 while leaving the metallic thin film 20 on the inner side as the first joint conductor thin film portions 19a for the second kind electrode conductor thin film 17 (at Step B). In other words, the donut shape is etched off to form the through holes 16 while leaving the joint conductor thin film portions 19a for electrically connecting with the electrode conductor thin film. At Step 2 of FIG. 6, Step A is executed.

Subsequently, the process advances to Step 3, at which the dielectric thin film 13 is formed to cover the whole face of the second kind electrode conductor thin film 17 (or the first kind electrode conductor thin film 14 at Step B) after etched. In case the sol-gel method is used, the following step can be adopted, for example. At first, in case alkoxide such as barium titanate for the material of a highly dielectric oxide to form the dielectric thin film is used as a main dielectric material, titanium isopropoxide is dissolved together with metallic barium in an organic solvent of the alcohol family. At this time, the metallic barium reacts with the organic solvent of the alcohol family so that it is dissolved in the form of barium alkoxide. In case strontium titanate or lead titanate is to be blended to adjust the dielectric characteristics or the like, strontium normalbutoxide or lead acetate may be dissolved in the solution. Here, the organic solvent of the alcohol family to be used as the solvent is desired to have chelate forming properties, such as a mixed solve of ethanol or acetylacetone or 2-ethoxyethanol. In order adjust the viscosity of the solution obtained, moreover, a small quantity (equal to or less than the organic solvent of the alcohol family) of water may be blended with the solution to polymerize the individual metal sources properly. The solution thus obtained is homogenized by heating it and is then applied in a film shape by the well-known method such as the spin coating method. The applied film is dried and then fire data 500° C. or more and 1,000° C. or less to provide a crystalline and highly dielectric thin film. Here, the sol-gel method may be replaced by the sputtering or CVD method.

At this time, the donut-shaped clearances between the through holes 18 (or the through holes 16 at Step B) and the first joint conductor thin film portions 19a (or the first joint conductor thin film portions 15a) are buried with the material of the dielectric thin film 13 so that the dielectric hole filling portions 13v are formed. At this time, the joint conductor thin film portions 19a (15a) on the inner side of the dielectric hole filling portions 13v are once covered with the dielectric thin film 13 but are exposed by forming through holes 13h by the photolithography method (in which an aqueous solution of hydrofluoric acid can be used as the etching liquid). In order to form the first joint conductor thin film portions 19a (or the joint conductor thin film portions 15a at Step B) for the second kind electrode conductor thin film 17 (or the first kind electrode conductor thin film 14 at Step B), the through holes 13h are formed at the positions corresponding thereto. Here in case the second kind electrode conductor thin film 17 (or the first kind electrode conductor thin film 14 at Step B) is used as the aforementioned distance converting thin film LT, the positions to form the through holes 13h may be displaced according to the distance conversions.

At Step 4, moreover, the metallic thin film 20 is formed as at Step 1. The through holes 13h formed at Step 3 are filled with the metal to form the second joint conductor thin film portions 19b (15b), and are integrated with the first joint conductor thin film portions 19a (15a) to form the joint conductor portions 19 (15). Then, the process returns to Step 2, and the subsequent Steps are repeated to laminate the first kind electrode conductor thin film 14 and the second kind electrode conductor thin film 17 sequentially isolatedly of the DC current, as indicated at Step 5 (although Step A and Step B are alternately repeated at Step 4). In FIG. 4, after the lamination of the first kind electrode conductor thin film 14 and the second kind electrode conductor thin film 17 was completed, the signal joint conductor 22, the leading wiring portion 21 and the auxiliary dielectric layer 12 are laminated all at once. Then, the terminals 5s, 5b and 5a are formed by the plating method or the like, a protective ceramic layer 11 also acting as the solder resist layer is then formed with silicon dioxide to complete the capacitor 1. In the manufacturing process described herein, the electrode conductor thin film to be formed over the principal face of a base 52 is the second kind electrode conductor thin film 17, and the electrode conductor thin film insulated and opposed is the first kind electrode conductor thin film 14. However, no distinction is made between the first kind and the second kind. In other words, the electrode conductor thin film to be formed over the main face of the base 52 maybe called the "first kind electrode conductor thin film", and the insulated and opposed electrode conductor thin film may also be called the "second kind electrode conductor thin film".

Figure 14:
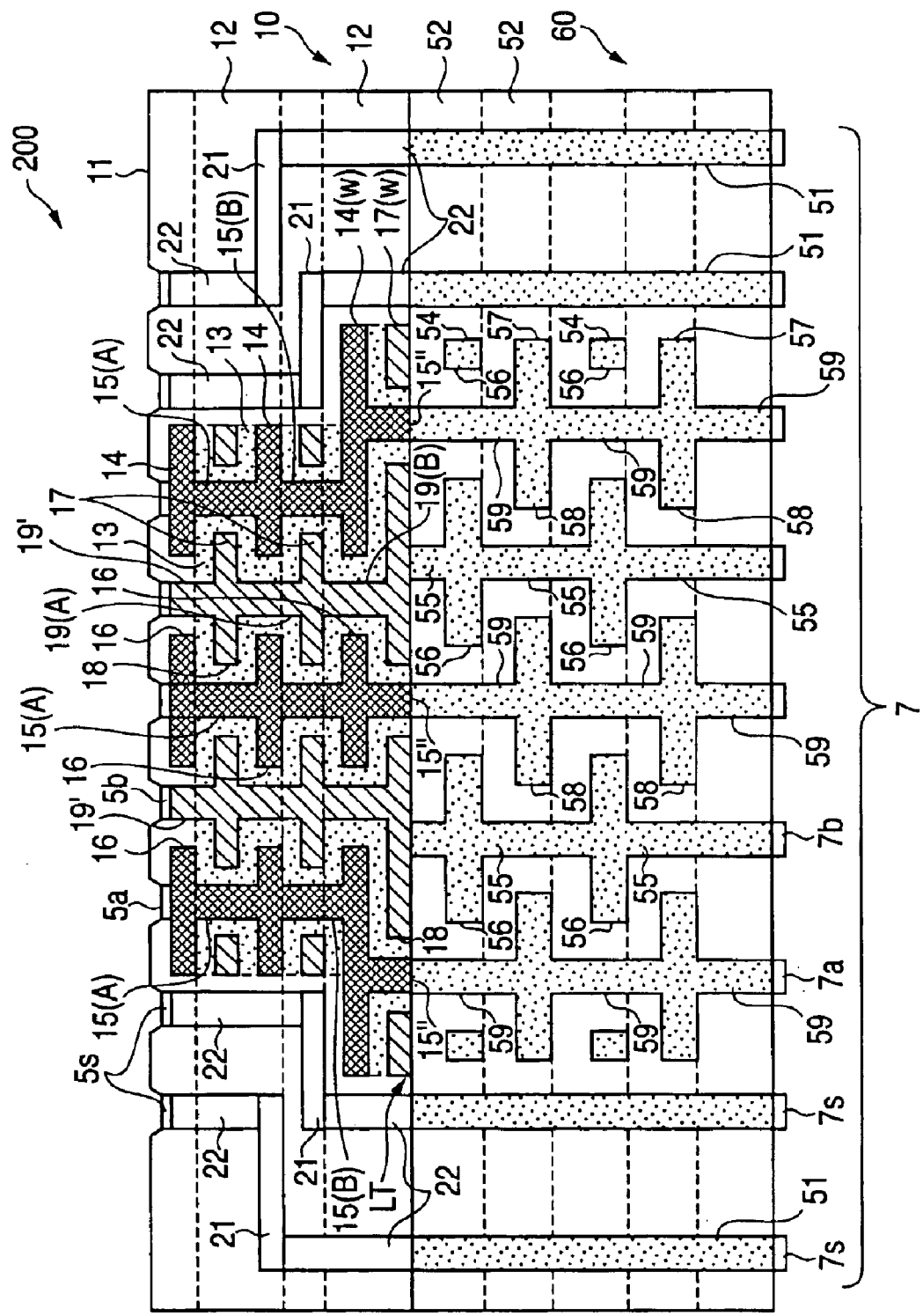
FIG. 14 is a sectional view showing a seventh modification of the capacitor of FIG. 4.

Like a capacitor (or an intermediate substrate) 200 shown in FIG. 14, the plate-shaped base can also be constructed as a laminated ceramic capacitor base 60 by alternately laminating the fired ceramic dielectric layer 52 and electrode conductor layers 54 and 57 co-fired with the fired ceramic dielectric layer 52. This laminated ceramic capacitor base 60 can be manufactured by using a ceramic green sheet like that of the plate-shaped base 50 of FIG. 4, and the electrode conductor layers 54 and 57 can be formed by printing and applying metallic paste. The electrode conductor layers 54 or 57 of the same polarity are electrically connected with each other in the laminate direction by base side joint conductor portions 55 and 59 making vias, but the electrode conductor layers 54 and 57 and the base side joint conductor portions 59 and 55 are isolated from each other in the DC current by through holes 56 and 58 formed in the individual electrode conductor layers 54 and 57 at the print patterning time of the metallic paste.

From the viewpoint of a larger capacity, it is desired that the dielectric layer 52 to be used in the laminated ceramic capacitor 60 is made of a dielectric ceramics with high dielectric constant (e.g., the aforementioned perovskite type oxide layer). In case the electrostatic capacity on the side of the laminated ceramic capacitor 60 is to be positively set to a low value so as to expand the band for a lower impedance to the high frequency side, on the other hand, the dielectric layer 52 to be used in the laminated ceramic capacitor 60 can also be made of normally dielectric ceramics.

Figure 15:
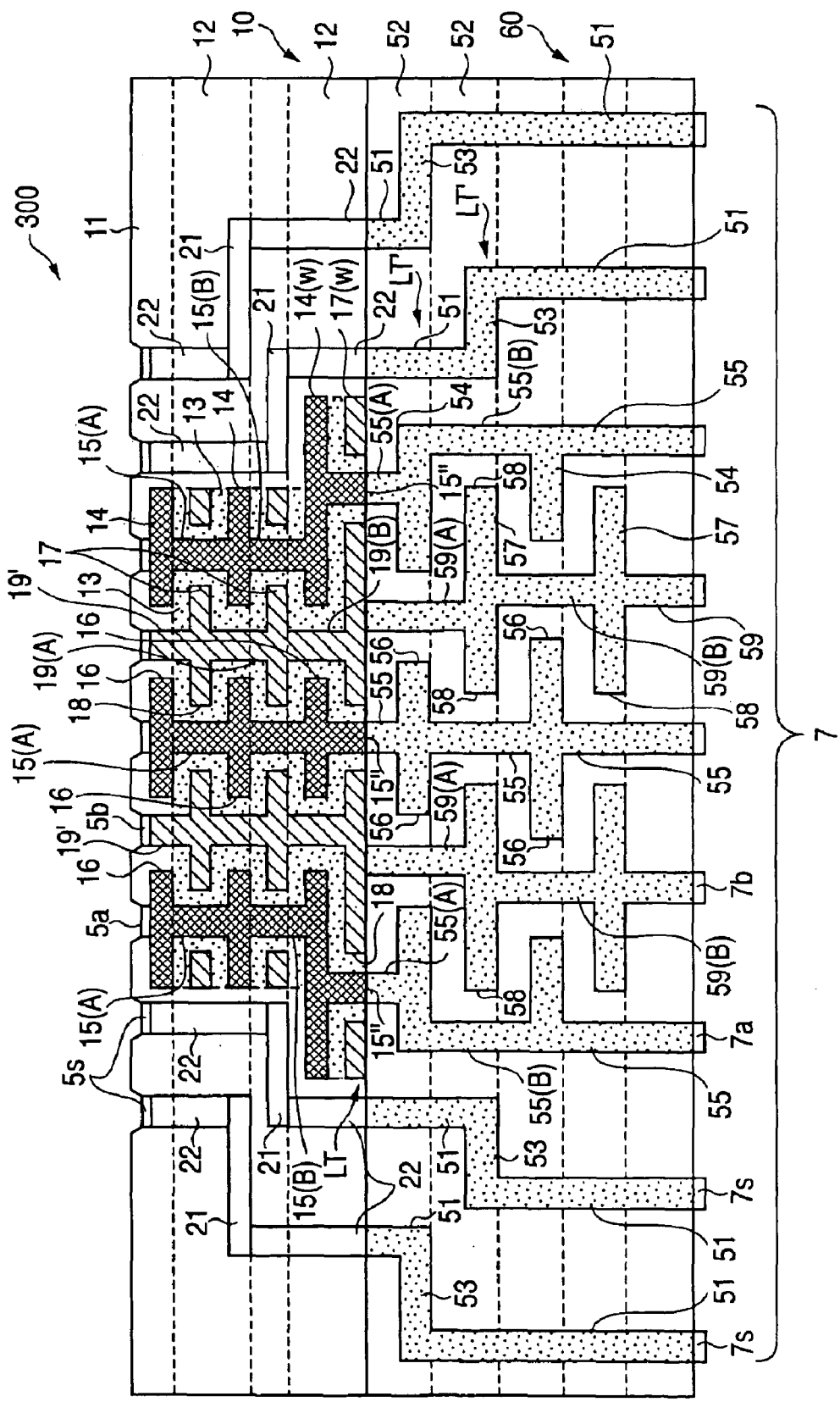
FIG. 15 is a sectional view showing an eighth modification of the same.
Figure 16:
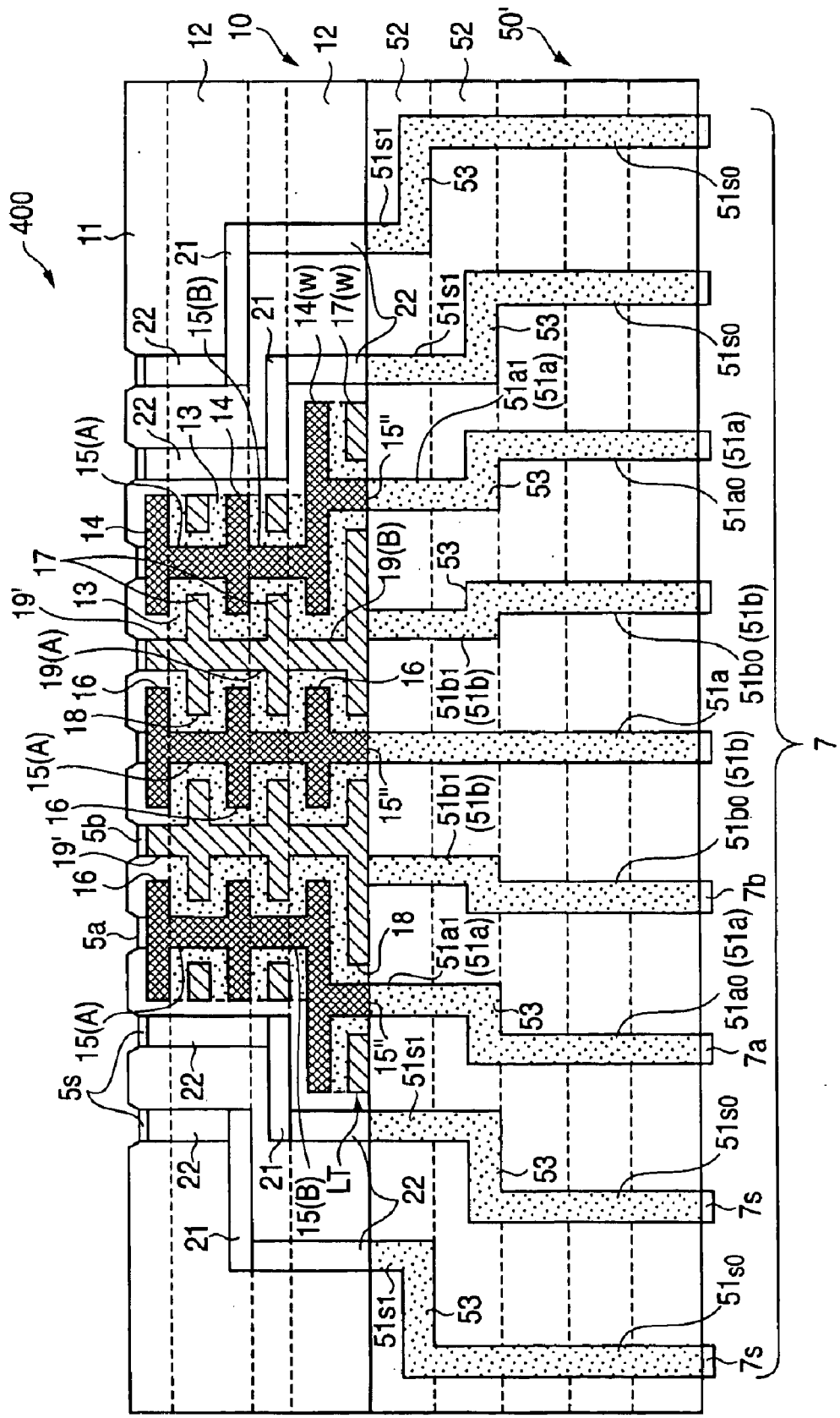
FIG. 16 is a sectional view showing a tenth modification of the same.

Like a capacitor (or an intermediate substrate) 300 of FIG. 15, moreover, the electrode conductor layers 54 and 57 in the laminated ceramic capacitor base 60 may be formed into terminal distance conversion layers LT∴ having different connection positions of the upper and lower base side joint conductor portions 55 and 59, like the distance converting thin films LT in the thin film laminate 10, so that the terminal distances may be converted at the laminated ceramic capacitor substrate 60. In FIG. 15, the terminal distances are converted at two stages by providing the distance converting thin films LT in the thin film laminate 10 thereby to enlarge the array distances of the joint conductor portions 15 and 19 to a proper value and by enlarging the array distances of the base side joint conductor portions 59 and 55 with the terminal distance converting layers LT' in the laminated ceramic capacitor base 60. Even in case a plate-shaped base 50' having no capacitor is used like a capacitor 400 shown in FIG. 16, too, the terminal distances can be converted by providing leading wiring portions 53 between the base side joint conductor portions 51*a* and 51*b* (i.e., upper base side joint conductor portions 51*a*1 and 51*b*1 and lower base side joint conductor portions 51*a*0 and 51*b*0) having one-side ends exposed to the first main surface and the other-side ends exposed to the second main surface. The plate-shaped base 50' is the so-called "wiring substrate (or the package substrate). In FIG. 16, the array distance between the first terminal joint conductor portions 15 and the second terminal joint conductor portions 19 on the second main surface of the thin film laminate 10 is smaller than that between the first kind base side joint conductor portions 51*a* and the second kind base side joint conductor portions 51*b* on the second main surface of the plate-shaped base 50'.

In all the capacitors of the invention thus far disclosed in the embodiment, the thin film capacitor 10 has the construction, in which the plural first kind electrode conductor thin films and the plural second kind electrode conductor thin films are laminated. However, the thin film capacitor may be formed to include one first kind electrode conductor thin film and one second kind electrode conductor thin film. Moreover, the thin film capacitor 10 may be omitted from the capacitor 300 of FIG. 15, and a capacitor 500 may also be modified such that the essential portion is constructed of only the laminated ceramic capacitor base 60, as shown in FIG. 15-A.

Figure 17:
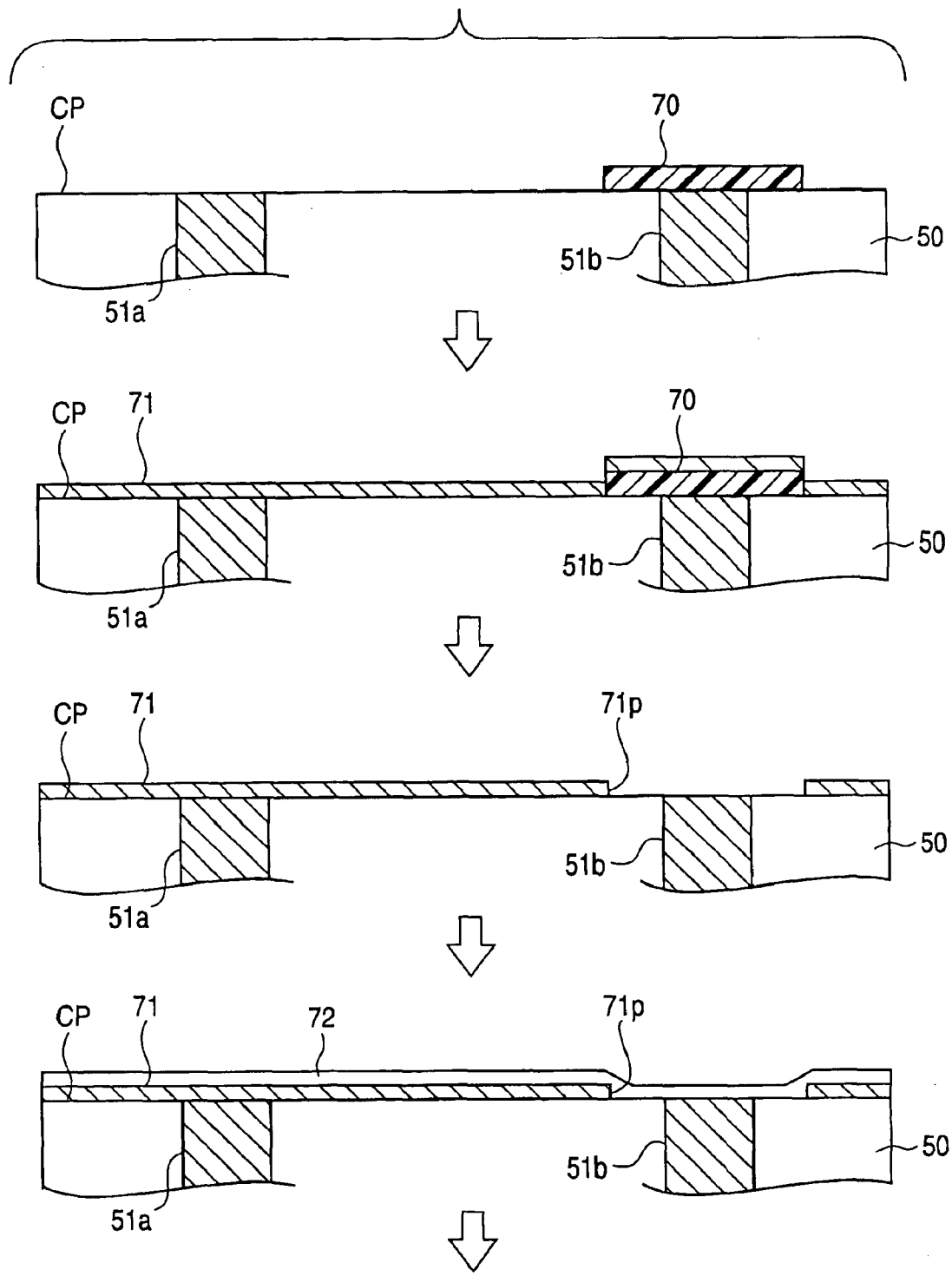
FIG. 17 presents step diagrams showing a second embodiment of the capacitor manufacturing process according to the invention.
Figure 18:
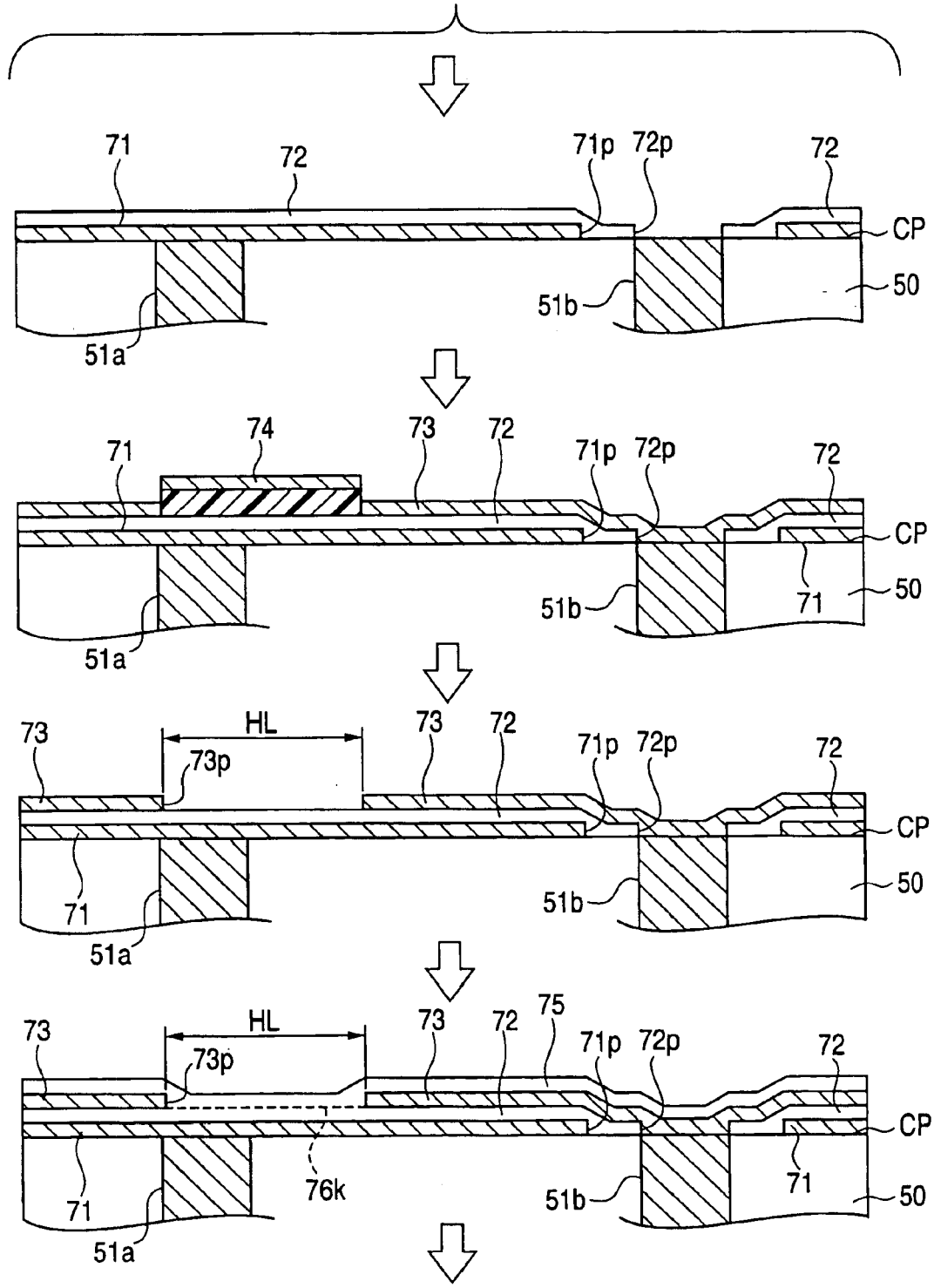
FIG. 18 presents step diagrams subsequent to FIG. 17.
Figure 19:
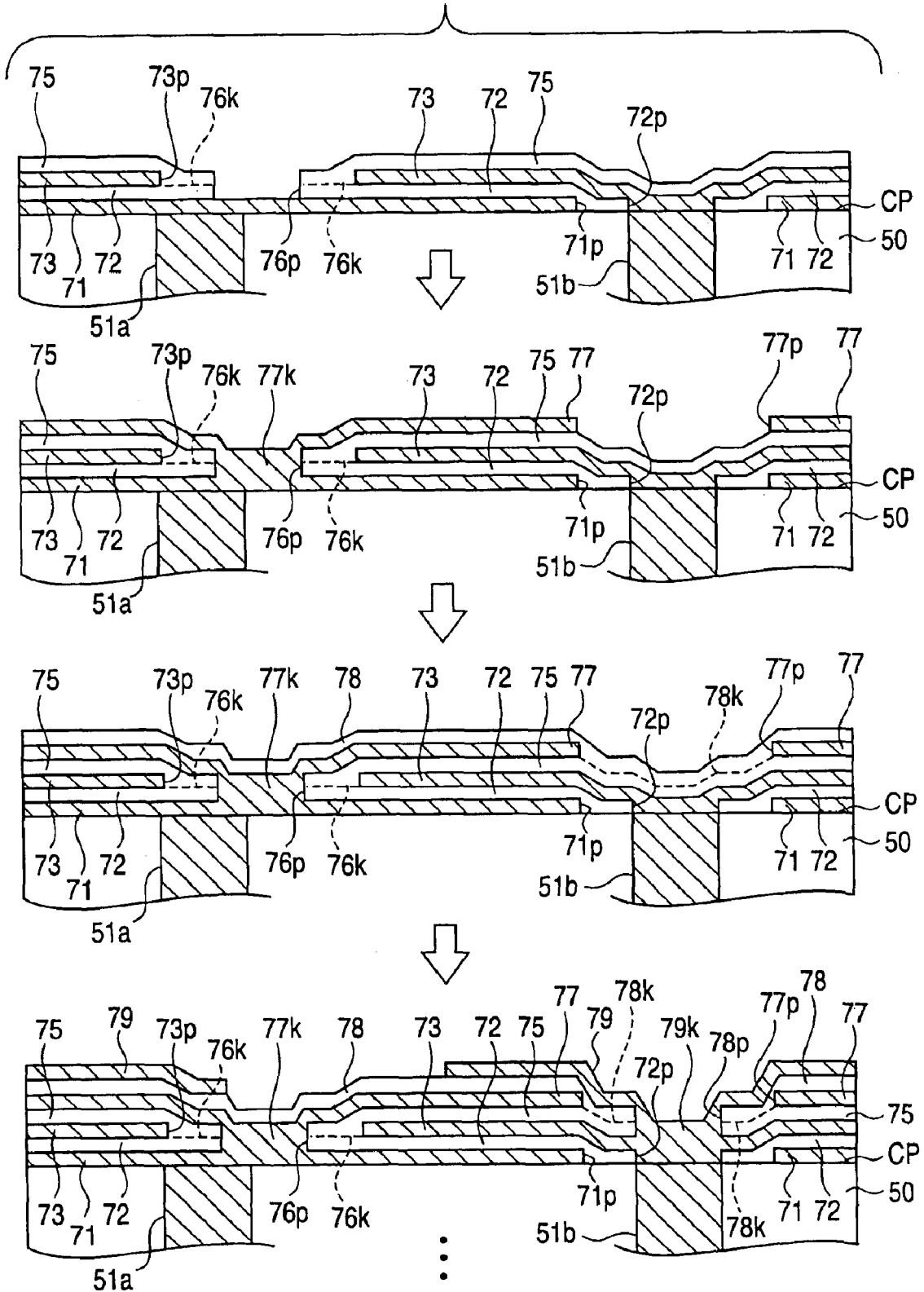
FIG. 19 presents step diagrams subsequent to FIG. 18.

Although the processes for manufacturing the capacitors 1, 1A, 1B, 1C, 1D, 1E, 200, 300 and 400 of the invention have been described with reference to FIG. 6, the manufacture processes of other modes will be described in the following. Specifically, FIG. 17 to FIG. 19 are diagrams showing a second embodiment of the process for manufacturing the capacitor according to the invention. At first, there is prepared the plate-shaped base 50, in which the first kind joint conductor portions 51*a* and the second kind base side joint conductor portions 51*b* are exposed to a first main surface CP. The method for preparing the plate-shaped base 50 has already been described hereinbefore.

At first, as shown at the uppermost diagram of FIG. 17, a resist 70 is so patterned on the plate-shaped base 50 as to have a counter-tapered side face so that it may cover the first kind base side joint conductor portions 51*a* exposed to the first main surface CP of the plate-shaped base 50. This resist 70 is adjusted to have a thickness of 1 micron or more and 5 μm or less, for example. As shown at the second upper diagram of FIG. 17, a first kind electrode conductor thin film 71 is then so formed by the sputtering method or the like as to cover the first main surface CP of the plate-shaped base 50 and the resist 70. The thickness and so on of this first kind electrode conductor thin film 71 has already been described with reference to FIG. 6 and so on. Here, the first kind electrode conductor thin film 71 is made extremely thin, and the resist 70 is adjusted to have a thickness larger than that of the first kind electrode conductor thin film 71.

After the first kind electrode conductor thin film 71 was formed, a peeling liquid is brought into contact with the resist 70. At this time, the peeling liquid oozes from the side face portion of the resist 70 to peel off not only the resist 70 but also the first kind electrode conductor thin film 71 over the resist 70. This technique is called the "lift-off process". According to this lift-off process, the conductor thin film itself is not etched so that the process has merits such as simplicity, a low cost and independence from the material of an object to be patterned. In case a thin film capacitor requiring no fine patterning such as the LSI is to be manufactured, it is proper to adopt the lift-off process which is excellent in productivity.

It is natural that the so-called "etch-back process" may be adopted as the photolithography technique. After the first kind electrode conductor thin film 71 was formed to cover the first main surface CP of the plate-shaped base 50 as a whole, the resist may be patterned to remove a portion of the first kind electrode conductor thin film 71 by the chemical etching method or the like, thereby to expose the second kind base side joint conductor portions 51*b* to the outside. By the operations thus far described, the first kind electrode conductor thin film 71 having first through holes 71*p* for exposing the second kind base side joint conductor portions 51*b* to the outside is formed over the first main surface CP of the plate-shaped base 50, as shown in the upper third diagram of FIG. 17. Here, the first through holes 71*p* are made to have a larger diameter than that of the second kind base side joint conductor portions 51*b* and are positioned to confine the exposed faces of the second kind base side joint conductor portions 51*b* in their inner areas. By these first through holes 71*p*, the first kind electrode conductor thin film 71 is isolated in the DC current from the second kind base side joint conductor portions 51*b*.

Next, a first dielectric thin film 72 is formed to cover the main surface of the first kind electrode conductor thin film 71 and the portions exposed to the inner sides of the first through holes 71*p* formed in the first kind electrode conductor thin film 71, as shown in the upper fourth diagram of FIG. 17. At this point of time, the second kind base side joint conductor portions 51*b* remain covered with the first dielectric thin film 72. Next, through holes 72*p* are formed in the first dielectric thin film 72, as shown in the uppermost diagram of FIG. 18. By forming the through holes 72*p*, the second kind base side joint conductor portions 51*b* are exposed to the outside. These through holes 72*p* can be formed by patterning the first dielectric thin film 72 by the dry etching method or the chemical etching method. Moreover, the through holes 72*p* have a diameter substantially equal to that of the second kind base side joint conductor portions 51*b* so that the first kind electrode conductor thin film 71 and the inner circumferences of the first through holes 71*p* formed in the first kind electrode conductor thin film 71 remain covered with the first dielectric thin film 72. Thus, the process described from FIG. 17 and FIG. 18 are to form the first dielectric thin film 72 for covering the main surface of the first kind electrode conductor thin film 71 and the inner circumferences of the first through holes 71p formed in the first kind electrode conductor thin film 71. Here, the method for forming the dielectric thin film can adopt any of the aforementioned ones.

Next, there is formed a second kind electrode conductor thin film 73 which is made conductive with the through hole 72p (or the dielectric holes in the dielectric thin film 72) formed in the first dielectric thin film 72 but which is isolated in the DC current from the first kind base side joint conductor portions 51a, as shown in the upper second diagram of FIG. 18. Here, before the second kind electrode conductor thin film 73 is formed, a resist 74 is patterned over the main surface of the first dielectric thin film 72. This resist 74 is provided for forming second through holes 73p in the second kind electrode conductor thin film 73, as shown in the upper third diagram of FIG. 18. Thus, the lift-off process for forming the resist prior to the patterned member (i.e., the second kind electrode conductor thin film 73) has already been described with reference to FIG. 17.

When the resist 74 is removed with the peeling liquid, the second kind electrode conductor thin film 73 is partially removed together with the resist 74 so that the second through holes 73p are formed in the second kind electrode conductor thin film 73. The second through holes 73p may be formed to have an extremely shallow cylindrical shape. These second through holes 73p extend to the first dielectric thin film 72 so that the first dielectric thin film 72 is exposed to the insides of the second through holes 73p. Moreover, the second through holes 73p are formed such that the inner area HL at the time when the second through holes 73p are projected in the laminate direction have an overlap in the in-plane direction with the first kind electrode conductor thin film 71 adjacent below the first dielectric thin film 72. More specifically, the inner area HL of the second through holes 73p has a positional relation to overlap the first kind electrode conductor thin film 71 in its entirety.

Next, there is formed a second dielectric thin film 75, which is integrated with the first dielectric thin film 72 in the inner area HL of the second through holes 73p and which covers the second kind electrode conductor thin film 73 and the inner circumferences of the second through holes 73p formed in the second kind electrode conductor thin film 73, as shown in the upper fourth diagram of FIG. 18. If the second dielectric thin film 75 is formed by the sputtering or spin coating method, the second dielectric thin film 75 is naturally formed in the second through holes 73p so that no special operation is needed for integrating the first dielectric thin film 72 and the second dielectric thin film 75. The first dielectric thin film 72 and the second dielectric thin film 75 thus integrated construct dielectric hole filling portions 76k.

Next, as shown in the uppermost diagram of FIG. 19, the dielectric hole filling portions 76k, which are formed of the first dielectric thin film 72 and the second dielectric thin film 75 integrated in the inner area HL of the second through holes 73p formed in the second kind electrode conductor thin film 73, are etched off in a donut shape to form dielectric thin film side through holes 76p extending to the first kind electrode conductor thin film 71. However, the inner circumferences of the second through holes 73p remain coated with the donut-shaped dielectric hole filling portions 76k. The dielectric thin film side through holes 76p are provided for exposing the first kind electrode conductor thin film 71 to the out side. When a metal of a proper thickness is sputtered or deposited, as shown in the upper second diagram of FIG. 19, the upper first kind electrode conductor thin film 77 to electrically connect with the lower first kind electrode conductor thin film 71 is laminated either in the dielectric thin film side through holes 76P or at a joint conductor portion 77k in the inner area HL of the second through holes 73p.

Thus, between the joint conductor portions 77k jointing the first kind electrode conductor thin films 71 and 77 having the same polarity (of the power source, for example) and the second kind electrode conductor thin film 73 having the opposite polarity (of the ground, for example), there exist the dielectric hole filling portions 76k which integrate the first dielectric thin film 72 and the second dielectric thin film 75. These dielectric hole filling portions 76k enclose the joint conductor portion 77k all over the circumference in the inner area HL of the second through holes 73p of the second kind electrode conductor thin film 73 so that the outer circumference of the joint conductor portion 77k and the inner circumferences of the second through holes 73p of the second kind electrode conductor thin film 73 are isolated in the DC current.

In this embodiment, the dielectric thin film through holes 76p are made to have a smaller diameter than that of the second through holes 73p of the second kind electrode conductor thin film 73. Moreover, the two through holes 73p and 76p are arranged coaxially with each other. Even after the dielectric thin film side through holes 76p were formed, therefore, the dielectric hole filling portions 76k keep the coating state of the inner circumferences of the second through holes 73p. According to this method, the DC isolation between the first kind electrode conductor thin films 71 and 77 and the second kind electrode conductor thin film 73 can be reliably isolated in the DC current, and the electrode conductor thin films of the same polarity can be easily electrically connected with each other.

On the other hand, the axes of the second through holes 73p take a positional relation, in which they are displaced in the in-plane direction with respect to the axes of the first kind base side joint conductor portions 51a. Specifically, there is shown the essential portion of the structure (i.e., the so-called "fan-out structure"), in which the terminal distance of the base side terminal array 7 matches the terminal distance of the thin film laminate side terminal array 5 while keeping the isolated DC state between the electrode conductor thin film having the polarity of the power source and the electrode conductor thin film having the polarity of the ground.

As shown in the upper third diagram of FIG. 19, moreover, a third dielectric thin film 78 is formed over the first kind electrode conductor thin film 77 by using the individual steps thus far described. This third dielectric thin film 78 is integrated with the second dielectric thin film 75 just below one layer through through holes 77p formed in the first kind electrode conductor thin film 77, thereby to form dielectric hole filling portions 78k. As shown in the upper fourth diagram of FIG. 19, moreover, the center portions of the dielectric hole filling portions 78k are etched off by the method like before to form dielectric thin film side through holes 78p, through which the upper and lower second kind electrode conductor thin films 73 and 79. Thus, the step of laminating and patterning the electrode conductor thin films 71 and 77 on the power side, the step of laminating and patterning the dielectric thin films 72, 75 and 78, and the step of laminating and patterning the electrode conductor thin films 73 and 79 on the ground side are repeated in the recited order. After the electrode conductor thin films and the dielectric thin films were completely laminated, moreover, the signal joint conductor 22, the leading wiring portion 21 and the auxiliary dielectric layer 12 are laminated all at once. After the terminals 5s, 5b and 5a were formed by the plating method, moreover, the protective layer 11 acting as the solder resist layer is formed with silicon dioxide to complete the capacitor according to the invention.

In the capacitor manufactured by adopting the manufacture method of FIG. 17 to FIG. 19, the portions for electrically connecting the upper and lower electrode conductor thin films are rather recessed in a conical shape, as shown in the upper fourth diagram of FIG. 19. However, the thickness of the electrode conductor thin films or the thickness of the dielectric thin films is about 1 micron or less so that a large roughness is not made as a matter of fact. Moreover, a suitable method for flattening the surfaces of the films, such as the spin coating method can be suitably selected as the method for forming the dielectric thin films.

Figure 20:
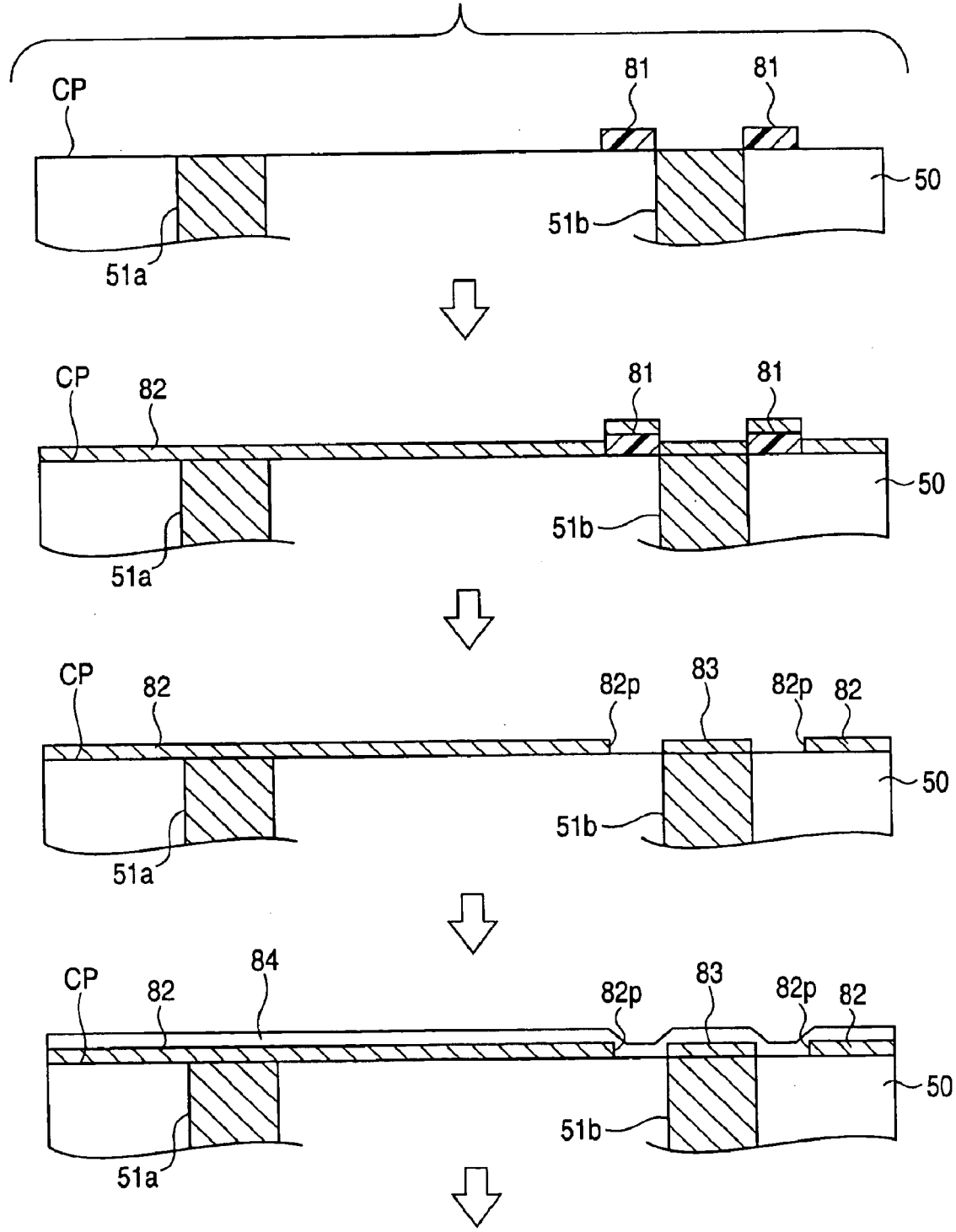
FIG. 20 presents step diagrams showing a third embodiment of the capacitor manufacturing process according to the invention.
Figure 21:
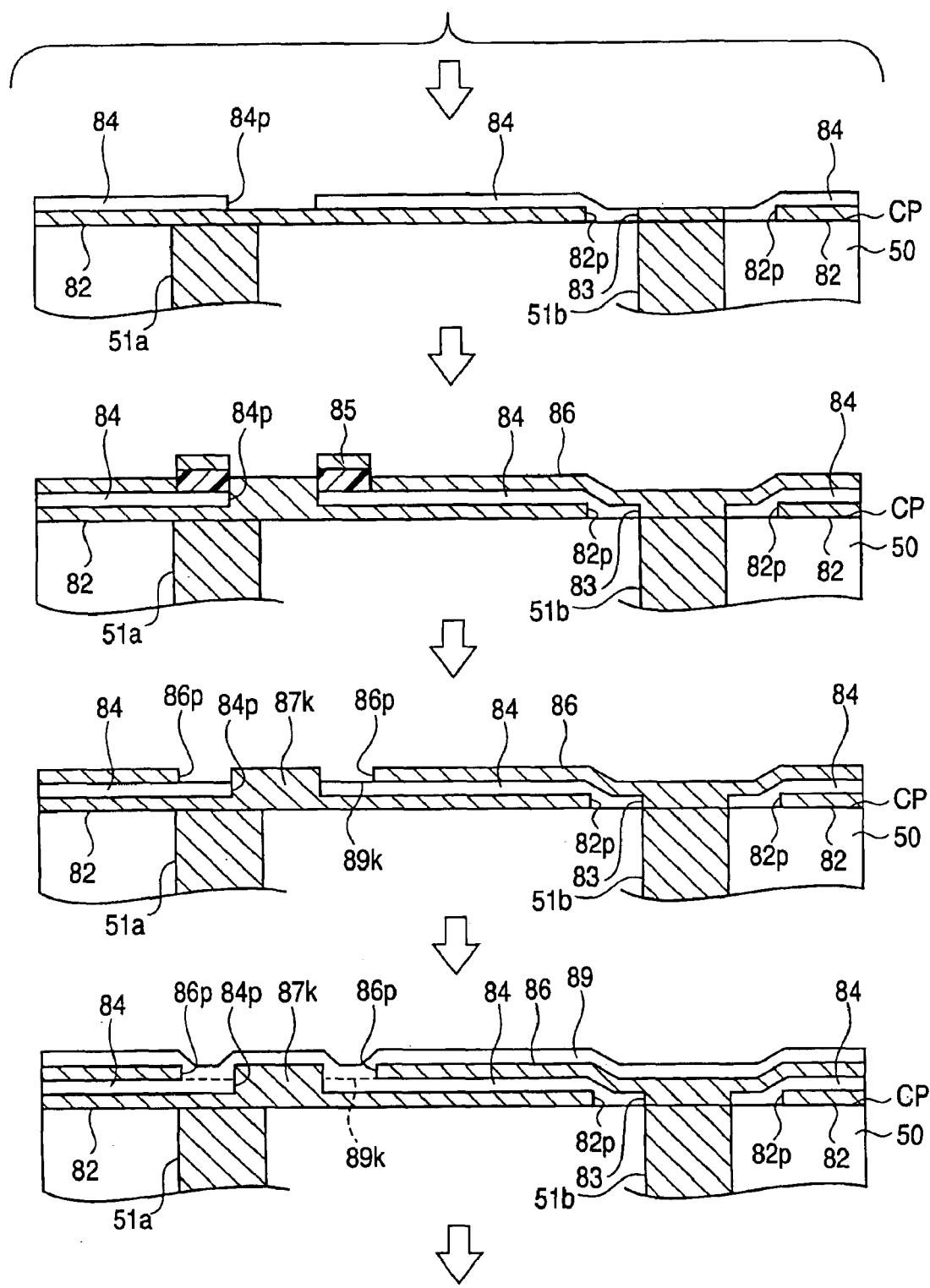
FIG. 21 presents step diagrams subsequent to FIG. 20.
Figure 22:
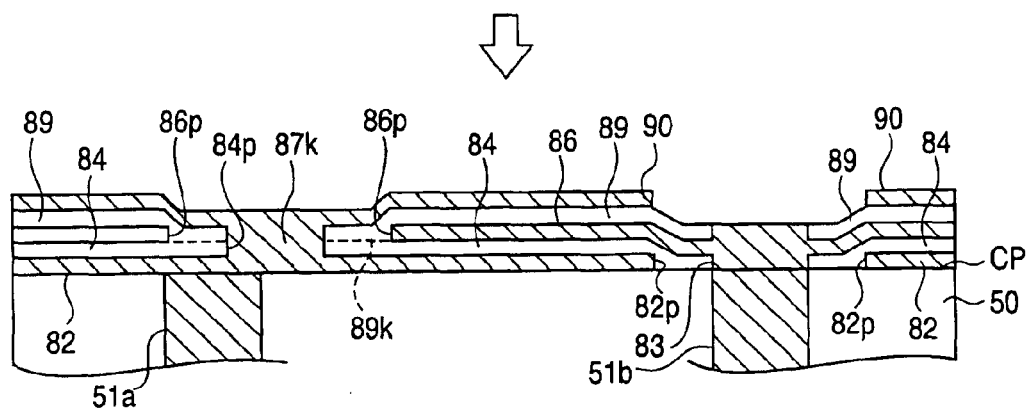
FIG. 22 presents step diagrams subsequent to FIG. 21.

Next, FIG. 20 to FIG. 22 are step explaining diagrams showing a third embodiment of a capacitor manufacturing process according to the invention. For the explanations of the individual steps, most of the descriptions of the second embodiment can be quoted so that the following description will be centered on the different points. As shown in the uppermost diagram of FIG. 20, a resist 81 is patterned in a donut shape around the second kind base side joint conductor portions 51b exposed to the first main surface CP of the plate-shaped base 50. As shown in the upper second and third diagrams of FIG. 20, a metal is deposited by the sputtering method or the like, and the resist 81 is removed to form a first kind electrode conductor thin film portion 82 having ring-shaped through holes 82p. Just above and adjacent to the second kind base side joint conductor portions 51b, there is formed an electrode conductor thin film portion 83, which is isolated in the DC current from the first kind electrode conductor thin film portion 82. By thus forming the electrode conductor thin film portion 83, it is possible to prevent the roughness, which might otherwise become serious as the plural electrode conductor thin films and the plural dielectric thin films are laminated. This point is similar to the first embodiment, as described with reference to FIG. 6.

Next, a first dielectric thin film 84 is formed, as shown in the upper fourth diagram of FIG. 20. The donut-shaped through holes 82p are coated on their inner circumferences with the first dielectric thin film 84 so that the first kind electrode conductor thin film portion 82 and the second kind base side joint conductor portions 51b are reliably isolated. Next, the first dielectric thin film 84 is so partially removed by the photolithography technique that the electrode conductor thin film portion 83 covering the second kind base side joint conductor portions 51b may be exposed, as shown the uppermost diagram of FIG. 21. At this time, through holes 84p are also formed for exposing the first kind electrode conductor thin film portion 82 to the outside.

Next, as shown in the upper second diagram of FIG. 21, a resist 85 is patterned in a donut shape on the circumferential edge portions of the through holes 84p formed in the first dielectric thin film 84 thereby to form a second kind electrode conductor thin film portion 86. As shown in the upper third diagram of FIG. 21, moreover, the resist 84 is removed to form such donut-shaped through holes 86p in the second kind electrode conductor thin film portion 86 that joint conductor portions 87k to be jointed to the first kind electrode conductor thin film portion 82 may be positioned at the centers. Moreover, the second kind electrode conductor thin film portion 86 is conductive with the second kind base side joint conductor portions 51b through the electrode conductor thin film portion 83. In other words, the electrode conductor thin film portion 83 functions as the joint conductor portion to connect the second kind base side joint conductor portions 51b and the second kind electrode conductor thin film portion 86.

As shown in the upper fourth diagram of FIG. 21, moreover, a second dielectric thin film 89 is formed to integrate the first dielectric thin film 84 and the second dielectric thin film 89 in the donut-shaped through holes 86p thereby to form dielectric hole filling portions 89k. These dielectric hole filling portions 89k are interposed between the joint conductor portions 87k formed adjacent to the first kind electrode conductor thin film portion 82 and the inner circumferences of the through holes 86p of the second kind electrode conductor thin film portion 86. As a result, the first kind electrode conductor thin film portion 82 and the second kind electrode conductor thin film portion 86 are isolated in the DC current. As shown in FIG. 22, moreover, similar procedures are repeated to end the step of laminating the electrode conductor thin films and the dielectric thin films.

Several embodiments of the capacitor and several embodiments of the capacitor manufacturing process have been described hereinbefore. Here, it is mentioned that the descriptions of the individual embodiments can be quoted by one another. It is also natural that the individual embodiments can be combined in various manners without departing from the gist of the invention.

This application is based on Japanese Patent application JP 2003-176894, filed Jun. 20, 2003, Japanese Patent application JP 2003-176895, filed Jun. 20, 2003, Japanese Patent application JP 2003-176897, filed Jun. 20, 2003, and Japanese Patent application JP 2004-130788, filed Apr. 27, 2004, the entire contents of which are hereby incorporated by reference, the same as if set forth at length.

What is claimed is:

1. A capacitor comprising: a thin film laminate including a plurality of dielectric thin films and a plurality of electrode conductor thin films laminated alternately; and first kind terminals and second kind terminals formed over a first main surface of said thin film laminate and isolated from each other in a DC current, wherein a first kind electrode conductor thin films electrically connecting with said first kind terminals and a second kind electrode conductor thin films electrically connecting with said second kind terminals are so alternately laminated in a laminate direction as are separated by said dielectric thin films, and a first dielectric thin film, an other kind electrode conductor thin film and a second dielectric thin film are laminated in this order between one same kind electrode conductor thin film and other same kind electrode conductor thin film adjoining in said laminate direction, first through holes formed in said first dielectric thin film and second through holes formed in said other kind electrode conductor thin film have an overlap in an in-plane projection, and said second through holes and third through holes formed in said second dielectric thin film have an overlap in an in-plane projection, and joint conductor portions for jointing said one same kind electrode conductor thin film and said other same kind electrode conductor thin film are so formed as a thin film portion integrated with at least either of two same kind electrode conductor thin films as to fill said first through holes and said third through holes, so that an outer circumferences of said joint conductor portions and an inner circumferences of said second through holes are isolated in a DC current in said second through holes by dielectric hole filling portions integrated with said first dielectric thin film and said second dielectric thin film.

2. The capacitor according to claim 1, wherein said through holes are formed in said electrode conductor thin films and said dielectric thin films by a photolithography method.

3. The capacitor according to claim 1, wherein said dielectric thin films have a thickness of 10 to 1,000 nm.

4. The capacitor according to claim 3, wherein said joint conductor portions for electrically connecting with said electrode conductor thin films are formed in plurality for each of said electrode conductor thin films, and such ones of said joint conductor portions as are of different kinds and closest to each other have an edge distance of 20 $\mu$m or more and 300 $\mu$m or less.

5. The capacitor according to claim 4, wherein said first kind terminals and said second kind terminals are arranged individually in plurality over said first main surface of said thin film laminate at a predetermined distance and are jointed in a laminate direction either directly or through auxiliary joint conductor portions to said first kind electrode conductor thin film and said second kind electrode conductor thin film, respectively, which are closest to said first main surface, and terminal array, in which said plural first kind terminals and said plural second kind terminals are mixed, is formed on said first main surface of said thin film laminate such that different kind terminals closest to each other in said terminal array have an edge distance of 20 $\mu$m or more and 300 $\mu$m or less.

6. The capacitor according to claim 1, wherein said electrode conductor thin films and said joint conductor portions are formed by a vapor phase deposition method, and said dielectric thin films and said dielectric hole filling portions are formed by a vapor phase deposition method or a chemical solution deposition method.

7. The capacitor according to claim 1, wherein said dielectric thin films and said dielectric hole filling portions contain dielectric ceramics with high dielectric constant.

8. The capacitor according to claim 7, wherein said dielectric ceramics with high dielectric constant contain at least one of barium titanate, strontium titanate and lead titanate.

9. The capacitor according to claim 1, wherein a second main surface of said thin film laminate is jointed to a first main surface of a plate-shaped base, first kind base side terminals and second kind base side terminals isolated from each other in a DC current are formed on a second main surface of said plate-shaped base, and said first kind base side terminals and said second kind base side terminals are electrically connected with said first kind electrode conductor thin film and said second kind electrode conductor thin film, respectively, which are closest to a second main surface of said thin film laminate, through base side joint conductor portions extending through said plate-shaped base in a thickness direction.

10. The capacitor according to claim 9, wherein a thin film laminate side terminal array, in which said plural first kind terminals and said plural second kind terminals are mixed, is formed on said first main surface of said thin film laminate, a base side terminal array, in which said plural first kind base side terminals and said plural second kind base side terminals are mixed, is formed on a second main surface of said plate-shaped base, and said base side terminal array has a terminal array pitch set larger than that of said thin film laminate side terminal array.

11. The capacitor according to claim 10, wherein, in said thin film laminate side terminal array over said thin film laminate, said first kind terminals and said second kind terminals are jointed in a laminate direction either directly or through auxiliary joint conductor portions to said first kind electrode conductor thin film and said second kind electrode conductor thin film, respectively, which are closest to said first main surface, and on a first main surface of said plate-shaped base, individual end portions of the first kind base side joint conductor portions electrically connecting with said first kind base side terminals and second kind base side joint conductor portions electrically connecting with said second kind base side terminals are arrayed to have a larger distance than an end distance of said thin film laminate side terminal array, and are individually jointed in a laminate direction either directly or through auxiliary joint conductor portions to said first kind electrode conductor thin film and said second kind electrode conductor thin film, which are closest to a second main surface of said thin film laminate.

12. The capacitor according to claim 10, wherein, in said thin film laminate, at least one layer of said electrode conductor thin films is a distance converting thin film, in which said joint conductor portions are electrically connected at a first array distance on a side of said thin film laminate side terminal array with said electrode conductor thin film and in which said joint conductor portions are electrically connected at a second array distance larger than said first array distance on a side of said base side terminal array with said electrode conductor thin film.

13. The capacitor according to claim 12, wherein, in said thin film laminate, at least one layer of said first kind electrode conductor thin films and at least one layer of said second kind electrode conductor thin films individually serve as said distance converting thin films.

14. The capacitor according to claim 13, wherein, when said first kind electrode conductor thin films and said second kind electrode conductor thin films are defined such that a same kind electrode conductor thin film closest to said distance converting thin film on a side of said thin film laminate side terminal array is a before conversion thin film and such that the same kind electrode conductor thin film closest on a side of said base side terminal array is an after conversion thin film, joint positions of said joint conductor portions are made identical to each other in an in-plane direction between said before conversion thin film and said distance converting thin film and between said distance converting thin film and said after conversion thin film, and wherein said second through holes for passing said joint conductor portions therethrough are formed in a mutually displaced positional relation in the other kind electrode conductor thin films, which are individually positioned between said before conversion thin film and said distance converting thin film and between said distance converting thin film and said after conversion thin film.

15. The capacitor according to claim 1, wherein a second main surface of said thin film laminate is jointed to a first main surface of said plate-shaped base, first kind base side terminals and second kind base side terminals, which are isolated from each other in a DC current, are formed on a second main surface of said plate-shaped base, and said first kind base side terminals and said second kind base side terminals are electrically connected with said first kind electrode conductor thin film and said second kind electrode conductor thin film, respectively, which are closest to a second main surface of said thin film laminate.

16. The capacitor according to claim 1, wherein said first through holes and said third through holes are positioned within an inner area which is defined by projecting said second through holes in said laminate direction, and said first dielectric thin film is formed into said second through holes so that a height position of said first through holes in said laminate direction is adjusted to either a height position at substantially same level of said second through holes or a height position lowered from said second through holes to a side of said plate-shaped base.

17. A capacitor comprising: a thin film laminate including a plurality of dielectric thin films and a plurality of electrode conductor thin films laminated alternately; and first kind terminals and second kind terminals formed over a first main surface of said thin film laminate and isolated from each other in a DC current, wherein first kind electrode conductor thin films electrically connecting with said first kind terminals and second kind electrode conductor thin films electrically connecting with said second kind terminals are so alternately laminated in a laminate direction as are separated by said dielectric thin films, and wherein a first dielectric thin film, other kind electrode conductor thin film and a second dielectric thin film are laminated in this order between one same kind electrode conductor thin film and other same kind electrode conductor thin film adjoining in said laminate direction, in an inner area which is defined by projecting through holes formed in said other kind electrode conductor thin film in said laminate direction, there are positioned joint conductor portions, in which said one same kind electrode conductor thin films and said other same kind electrode conductor thin films are jointed to each other, between said joint conductor portions and said other kind electrode conductor thin films, there are interposed dielectric hole filling portions, in which said first dielectric thin films and said second dielectric thin films are integrated, and said dielectric hole filling portions enclose said joint conductor portions in said inner area of said through holes so that an outer circumferences of said joint conductor portions and an inner circumferences of said through holes of said other kind electrode conductor thin films are isolated from each other in a DC current.

18. A process for manufacturing a capacitor, comprising: a base preparing step of preparing a plate-shaped base, in which first kind base side joint conductor portions and second kind base side joint conductor portions isolated from each other in a DC current are exposed to a first main surface; and a thin film laminate forming step of a thin film laminate, in which a plurality of dielectric thin films and a plurality of electrode conductor thin films are alternately laminated, over said plate-shaped base, wherein said thin film laminate forming step includes:

(a) a step of forming a first kind electrode conductor thin film electrically connecting with said first kind base side joint conductor portion but isolated from said second kind base side joint conductor portion, over said first main surface of said plate-shaped base;

(b) a step of forming a first dielectric thin film for covering said first kind electrode conductor thin film;

(c) a step of forming dielectric holes in said first dielectric thin film, forming a second kind electrode conductor thin film to connect with said second kind base side joint conductor portions inside said dielectric holes and to be isolated from said first kind base side joint conductor portions in a DC current, and forming through holes for exposing said first dielectric thin film, in said second kind electrode conductor thin film;

(d) a step of forming a second dielectric thin film, which is integrated with said first dielectric thin film in an inner area defined by projecting said through holes formed in said second kind electrode conductor thin film in a laminate direction and which covers said second kind electrode conductor thin film and inner circumferences of said through holes formed in said second kind electrode conductor thin film; and (e) a step of forming dielectric holes in said second dielectric thin film and optionally in said first dielectric thin film, and forming an electrode conductor thin film to be electrically connected with said first kind electrode conductor thin film through said dielectric holes and to be isolated from said second kind electrode conductor thin film in a DC current.

19. The capacitor manufacturing process according to claim 18, wherein said step (a) includes a step of forming said first kind electrode conductor thin film having first through holes for exposing said second kind base side joint conductor portions, and said step (b) includes a step of forming said first dielectric thin film to cover a surface of said first kind electrode conductor thin film and inner circumferences of said first through holes formed in said first kind electrode conductor thin film.

20. The capacitor manufacturing process according to claim 18, wherein said step (d) includes:

a step of forming said second dielectric thin film for covering a surface of said second kind electrode conductor thin film and inner circumferences of said through holes formed in said second kind electrode conductor thin film; and a step of etching off a portion of dielectric hole filling portions, which are formed of said first dielectric thin film and said second dielectric thin film integrated by said inner area of said through holes formed in said second kind electrode conductor thin films, while keeping inner circumferences of said through holes of said second kind electrode conductor thin film being covered with said dielectric hole filling portions, thereby to form dielectric thin film side through holes leading to said first kind electrode conductor thin film, and said step (e) includes a step of forming said electrode conductor thin film isolated from said second kind electrode conductor thin film in a DC current so that said electrode conductor thin film may take direct contact with said first kind electrode conductor thin film exposed to insides of said dielectric thin film side through holes.

21. A capacitor comprising: a thin film laminate including a dielectric thin film and an electrode conductor thin film laminated alternately; and first kind terminals and second kind terminals formed over a first main surface of said thin film laminate and isolated from each other in a DC current, wherein first kind electrode conductor thin films electrically connecting with said first kind terminals and second kind electrode conductor thin films electrically connecting with said second kind terminals are so alternately laminated in a laminate direction as are separated by said dielectric thin films, and a second main surface of said thin film laminate is jointed to a first main surface of a plate-shaped base, wherein first kind base side terminals and second kind base side terminals isolated from each other in a DC current are formed on a second main surface of said plate-shaped base, and wherein said first kind base side terminals and said second kind base side terminals are electrically connected with said first kind electrode conductor thin film and said second kind electrode conductor thin film closest to a second main surface of said thin film laminate, respectively, through base side joint conductor portions extending through said plate-shaped base in a thickness direction.

22. The capacitor according to claim 21, wherein said first kind terminals and said second kind terminals are individually arranged in plurality at a predetermined distance on said first main surface of said thin film laminate, and said first kind terminals and said second kind terminals are jointed in a laminate direction either directly or through auxiliary joint conductor portions to said first kind electrode conductor thin film and said second kind electrode conductor thin film, respectively, which are closest to said first main surface.

23. The capacitor according to claim 21, wherein said dielectric thin films contain dielectric ceramics with high dielectric constant.

24. The capacitor according to claim 23, wherein said dielectric ceramics with high dielectric constant contain at least one of barium titanate, strontium titanate and lead titanate.

25. The capacitor according to claim 23, wherein said plate-shaped base is formed thicker than said thin film laminate and contains a ceramic material having a lower thermal expansion coefficient than that of said dielectric ceramics with high dielectric constant.

26. The capacitor according to claim 23, wherein said plate-shaped base contains a ceramic material having a higher Young's modulus than that of said dielectric ceramics with high dielectric constant.

27. The capacitor according to claim 21, wherein said plate-shaped base contains alumina or glass ceramics.

28. The capacitor according to claim 21, wherein said plate-shaped base is made of a laminated ceramic capacitor base, in which fired ceramic dielectric layers and electrode conductor layers co-fired with said fired ceramic dielectric layers are alternately laminated.

29. The capacitor according to claim 28, wherein said fired ceramic dielectric layers contain dielectric ceramics with high dielectric constant.

30. A capacitor comprising a laminate including a capacitor structure portion including dielectric layers and electrode conductor layers laminated alternately, wherein a plurality of first side first kind terminals and a plurality of first side second kind terminals, which are isolated from each other in a DC current, form a first terminal array on a first main surface of said laminate, and a plurality of second side first kind terminals and a plurality of second side second kind terminals, which are isolated from each other in a DC current, form a second terminal array on a second main surface of said laminate, said electrode conductor layers are formed such that first kind electrode conductor layers electrically connecting with said first kind terminals and second kind electrode conductor layers electrically connecting with said second kind terminals are so alternately laminated in a laminate direction as are spaced through said dielectric layers, and have joint conductor portions for jointing said first kind electrode conductor layers and said second kind electrode conductor layers individually to each other in a laminate direction, on said first main surface of said laminate, said first side first kind terminals and said first side second kind terminals of said first terminal array are jointed to said first kind electrode conductor layers and said second kind electrode conductor layers closest to said first main surface, respectively, either directly or through auxiliary joint conductor portions in a laminate direction, and on said second main surface of said laminate, said second side first kind terminals and said second side second kind terminals of said second terminal array are jointed to said first kind electrode conductor layers and said second kind electrode conductor layers closest to said second main surface, respectively, at a larger distance than that of said first terminal array either directly or through auxiliary joint conductor portions in a laminate direction.

31. The capacitor according to claim 30, wherein said plural dielectric layers and said plural electrode conductor layers are alternately laminated in said laminate, and at least one layer of said electrode conductor layers is a distance converting layer, to which said joint conductor portions are electrically connected at a first array distance on a side of said first terminal array and to which said joint conductor portions are electrically connected at a second array distance longer than said first array distance from a side of said second terminal array.

32. The capacitor according to claim 31, wherein, in said laminate, at least one of said first kind electrode conductor layers and at least one of said second kind electrode conductor layers are individually provided for said distance converting layer.

33. The capacitor according to claim 32, wherein, when said first kind electrode conductor layers and said second kind electrode conductor layers are defined such that same kind electrode conductor layer closest to said distance converting layer on a side of said first terminal array is a before conversion layer and such that same kind electrode conductor layer closest on a side of said second terminal array is an after conversion layer, joint positions of said joint conductor portions are made identical to each other in an in-plane direction between said before conversion layer and said distance converting layer and between said distance converting layer and said after conversion layer, and through holes for passing said joint conductor portions therethrough are formed in a mutually displaced positional relation in other kind electrode conductor layers, which are individually positioned between said before conversion layer and said distance converting layer and between said distance converting layer and said after conversion layer.

34. The capacitor according to claim 30, wherein at least one of group of said first kind electrode conductor layers and said second kind electrode conductor layers laminated on a side of said second main surface of said laminate have a larger area than that of at least one of group of said first kind electrode conductor layers and said second kind electrode conductor layers laminated on a side of said first main surface.

35. The capacitor according to claim 30, wherein ones of said dielectric layers and said first kind and second kind electrode conductor layers, which make said laminate, the ones being laminated on a side of said first main surface, are dielectric thin films and first kind and second kind electrode conductor thin films having a thickness of 1.5 µm or less, respectively, so that a thin film capacitor is formed by said dielectric thin films and said first kind and second kind electrode conductor thin films.

36. The capacitor according to claim 35, wherein, in said laminate, said thin film capacitor is formed over a first main surface of a plate-shaped base, first kind base side terminals corresponding to said second side first kind terminals and second kind base side terminals corresponding to said second side second kind terminals, which are isolated from each other in a DC current, are formed on a second main surface of said plate-shaped base, and said first kind base side terminals and said second kind base side terminals are individually electrically connected with a first kind electrode conductor thin film forming said first kind electrode conductor layer and a second kind electrode conductor thin film forming said first kind electrode conductor layer, which are closest to a second main surface of said thin film capacitor, respectively, through a base side joint conductor portions extending through said plate-shaped base in a thickness direction.

37. A process for manufacturing a capacitor, in which dielectric layers and electrode conductor layers are alternately laminated, a plurality of first side first kind terminals and a plurality of first side second kind terminals isolated from each other in a DC current form a first terminal array on a first main surface, and a plurality of second side first kind terminals and a plurality of second side second kind terminals isolated from each other in a DC current form a second terminal array on a second main surface, comprising:

laminating a first kind electrode conductor layer to electrically connect with said first kind terminals and a second kind electrode conductor layer to electrically connect with said second kind terminals, alternately in a laminate direction while being spaced by said dielectric layers, and providing joint conductor portions for jointing said first kind electrode conductor layers to each other and said second kind electrode conductor layers to each other individually in a laminate direction;

forming at least one layer of said first kind electrode conductor layers and said second kind electrode conductor layers, as a distance converting layer, with which one of said joint conductor portions is electrically connected at a first array distance on a side of said first terminal array and with which others of said joint conductor portions are electrically connected at a second array distance larger than said first array distance on a side of said second terminal array;

jointing said first side first kind terminals and said first side second kind terminals of said first terminal array on said first main surface to said first kind electrode conductor layer and said second kind electrode conductor layer closest to said first main surface, respectively, either directly or through auxiliary joint conductor portions; and jointing said second side first kind terminals and said second side second kind terminals of said second terminal array, on said second main surface, to said first kind electrode conductor layer and said second kind electrode conductor layer closest to said second main surface, respectively, at a larger distance than that of said first terminal array either directly or through auxiliary joint conductor portions.

38. The capacitor manufacturing process according to claim 37, wherein at least one of said first kind electrode conductor layers and at least one of said second kind electrode conductor layers are individually formed as said distance converting layer.

39. The capacitor manufacturing process according to claim 37, comprising:

a base preparing step of preparing a plate-shaped base, in which first kind base side joint conductor portions and second kind base side joint conductor portions isolated from each other in a DC current are exposed to a main surface; and a thin film capacitor forming step of forming a thin film capacitor, in which said dielectric thin films and said electrode conductor thin films are alternately laminated, over said plate-shaped base, wherein said distance converting layers are formed as a portion of said thin film capacitor at said thin film capacitor forming step.

40. The capacitor manufacturing process according to claim 39, wherein, at said thin film capacitor forming step, said first kind electrode conductor layers and said second kind electrode conductor layers are laminated alternately in a laminate direction while being spaced by said dielectric layers, and positions for forming the joint conductor portions to joint said first kind electrode conductor layers and said second kind electrode conductor layers individually to each other in a laminate direction are displaced in a plane with respect at least one of said first kind base side joint conductor portions and said second kind base side joint conductor portions of said plate-shaped base, thereby to form said distance converting layer.

41. The capacitor manufacturing process according to claim 40, in order that said first kind electrode conductor layers and said second kind electrode conductor layers are laminated alternately in a laminate direction while being spaced by said dielectric layers, and joint conductor portions for jointing said first kind electrode conductor layers and said second kind electrode conductor layers individually to each other in a laminate direction are formed at said thin film capacitor forming step, comprising:

(a) a step of forming a first kind electrode conductor thin film electrically connecting with said first kind base side joint conductor portion but isolated from said second kind base side joint conductor portion, over said first main surface of said plate-shaped base;

(b) a step of forming a first dielectric thin film for covering said first kind electrode conductor thin film;

(c) a step of forming dielectric holes in said first dielectric thin film, forming a second kind electrode conductor thin film to electrically connect with said second kind base side joint conductor portions inside said dielectric holes and to be isolated from said first kind base side joint conductor portions in a DC current, and forming communication portions for exposing said first dielectric thin film, in said second kind electrode conductor thin film;

(d) a step of forming a second dielectric thin film, which is integrated with said first dielectric thin film in an inner area defined by projecting said communication portions formed in said second kind electrode conductor thin film in a laminate direction and which covers said second kind electrode conductor thin film and said communication portions formed in said second kind electrode conductor thin film; and (e) a step of forming dielectric holes in said second dielectric thin film and optionally in said first dielectric thin film, and forming an electrode conductor thin film to electrically connect with said first kind electrode conductor thin film in said holes and to be isolated from said second kind electrode conductor thin film in a DC current, wherein, at said step (e), said holes formed in said second dielectric thin film and optionally in said first dielectric thin film are set at positions displaced in a plane from said first kind base side joint conductor portion of said plate-shaped base.

* * * * *